(12) United States Patent
Shim et al.

(10) Patent No.: US 12,310,185 B2
(45) Date of Patent: May 20, 2025

(54) DISPLAY DEVICE AND SENSING SYSTEM INCLUDING THE SAME

(71) Applicant: Samsung Display Co., Ltd., Yongin-Si (KR)

(72) Inventors: Chang Woo Shim, Cheonan-si (KR); Ju Yeon Kim, Asan-si (KR); Won Sang Park, Yongin-si (KR); Gi Na Yoo, Cheonan-si (KR); Seong Jun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 592 days.

(21) Appl. No.: 17/682,561

(22) Filed: Feb. 28, 2022

(65) Prior Publication Data

US 2023/0050455 A1     Feb. 16, 2023

(30) Foreign Application Priority Data

Aug. 11, 2021   (KR) .................. 10-2021-0105906

(51) Int. Cl.
*H10K 59/122* (2023.01)
*H10K 50/842* (2023.01)
(Continued)

(52) U.S. Cl.
CPC ....... *H10K 59/122* (2023.02); *H10K 50/8428* (2023.02); *H10K 59/1213* (2023.02);
(Continued)

(58) Field of Classification Search
CPC ............. H10K 59/122; H10K 50/8428; H10K 59/1213; H10K 59/123; H10K 59/126;
(Continued)

(56) References Cited

U.S. PATENT DOCUMENTS

| | | | |
|---|---|---|---|
| 2015/0162391 A1* | 6/2015 | Kim | .................. H10K 50/8428 |
| | | | 257/40 |
| 2016/0268363 A1* | 9/2016 | Hatano | .............. H10K 59/8792 |

(Continued)

FOREIGN PATENT DOCUMENTS

| | | |
|---|---|---|
| KR | 10-2014-0126091 A1 | 10/2014 |
| KR | 20180000975 A * | 6/2016 |

(Continued)

*Primary Examiner* — Kyoung Lee
*Assistant Examiner* — Sophia W Kao
(74) *Attorney, Agent, or Firm* — Innovation Counsel LLP

(57) ABSTRACT

Provided is a display device comprising a first substrate, a thin film transistor layer disposed on the first substrate and including a plurality of thin film transistors, a pixel defining layer disposed on the thin film transistor layer and defining a plurality of emission areas, a pixel electrode disposed in each of the emission areas on the thin film transistor layer, a plurality of spacers disposed on the pixel defining layer and distinguished from the pixel defining layer and the pixel electrode with respect to light of a specific wavelength, a touch electrode disposed on the plurality of spacers and configured to receive an input from an outside, and a code pattern having position information determined by a planar shape of each of the plurality of spacers.

22 Claims, 21 Drawing Sheets

(51) Int. Cl.
*H10K 59/121* (2023.01)
*H10K 59/123* (2023.01)
*H10K 59/126* (2023.01)
*H10K 59/38* (2023.01)

(52) U.S. Cl.
CPC ......... *H10K 59/123* (2023.02); *H10K 59/126* (2023.02); *H10K 59/38* (2023.02)

(58) Field of Classification Search
CPC ...... H10K 59/38; H10K 59/40; H10K 50/844; H10K 50/86; H10K 71/50; G06F 3/0446; G06F 3/042
See application file for complete search history.

(56) References Cited

U.S. PATENT DOCUMENTS

| | | | | |
|---|---|---|---|---|
| 2017/0155075 A1* | 6/2017 | Bi | ......................... | H10K 71/166 |
| 2017/0373124 A1* | 12/2017 | Yang | ..................... | H10K 59/879 |
| 2019/0252470 A1* | 8/2019 | Lee | ....................... | H10K 59/122 |
| 2020/0133414 A1* | 4/2020 | Lee | .......................... | G06F 3/044 |
| 2020/0210006 A1* | 7/2020 | Son | ........................ | G06F 3/0412 |
| 2021/0117043 A1* | 4/2021 | Lee | .......................... | G06F 3/044 |
| 2021/0200363 A1* | 7/2021 | Lee | ........................ | H10K 50/84 |
| 2021/0226175 A1* | 7/2021 | Cao | ......................... | H10K 59/38 |
| 2021/0408163 A1* | 12/2021 | Heo | ........................ | H10K 50/16 |

FOREIGN PATENT DOCUMENTS

| | | | |
|---|---|---|---|
| KR | 102138859 B1 * | 7/2019 | |
| KR | 10-2020-072890 A1 | 6/2020 | |

* cited by examiner

SPC  PDL   PG  AND1  EA2   AND3  SPC
(CP)           EA1 AND2  EA3      (CP)

DU: SUB, TFTL, EML, TFEL

DISPLAY DEVICE AND SENSING SYSTEM INCLUDING THE SAME

CROSS-REFERENCE TO RELATED APPLICATION

This application claims priority from Korean Patent Application No. 10-2021-0105906 filed on Aug. 11, 2021, in the Korean Intellectual Property Office, and all the benefits accruing therefrom under 35 U.S.C. 119, the contents of which in its entirety are herein incorporated by reference.

BACKGROUND

1. Technical Field

The present disclosure generally relates to a display device and a sensing system including the same. More particularly, the present disclosure relates to a display device and a sensing system including the same capable of generating input coordinate data of an input device without complex calculation and correction when an input is performed to the display device using the input device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. The display device may be a flat panel display device such as a liquid crystal display device, a field emission display device and an organic light emitting display device. Among the flat panel display devices, in the light emitting display device, since each of pixels of a display panel includes a light emitting element capable of emitting light by itself, an image can be displayed without a backlight unit providing light to the display panel.

A recent display device supports touch input using a user's body part (e.g., a finger) and input using an input pen. The input using the input pen allows the display device to detect the input more sensitively than the input using only a part of a user's body.

SUMMARY

Aspects of the present disclosure provide a display device and a sensing system including the same, which can perform a corresponding function by accurate input coordinates, reduce cost and power consumption, and simplify a driving process, by generating input coordinate data of an input device without complex calculation and correction when an input is performed to the display device using the input device.

However, aspects of the present disclosure are not restricted to the oneset forth herein. The above and other aspects of the present disclosure will become more apparent to one of ordinary skill in the art to which the present disclosure pertains by referencing the detailed description of the present disclosure given below.

According to an embodiment of the disclosure, a display device comprises a first substrate, a thin film transistor layer disposed on the first substrate and including a plurality of thin film transistors, a pixel defining layer disposed on the thin film transistor layer and defining a plurality of emission areas, a pixel electrode disposed in each of the emission areas on the thin film transistor layer, a plurality of spacers disposed on the pixel defining layer and distinguished from the pixel defining layer and the pixel electrode with respect to light of a specific wavelength, a touch electrode disposed on the plurality of spacers and configured to receive an input from an outside, and a code pattern having position information determined by a planar shape of each of the plurality of spacers.

The plurality of spacers may absorb light of the specific wavelength, and the pixel defining layer and the pixel electrode may transmit or reflect light of the specific wavelength.

The plurality of spacers may be irregularly arranged in plan view to form the code pattern.

A transmittance of the plurality of spacers with respect to a wavelength of 800 nm to 900 nm may be 15% or less.

The display device may further comprise a second substrate disposed on the plurality of spacers and supported by the plurality of spacers. The touch electrode may be disposed on the second substrate.

The display device may further comprise a plurality of color filters disposed in the plurality of emission areas on the second substrate, and a plurality of light blocking parts surrounding each of the plurality of color filters on the second substrate. The touch electrode may be covered by the light blocking part.

The display device may further comprise an insulating layer disposed on the second substrate, a plurality of color filters disposed in the plurality of emission areas on the insulating layer, and a plurality of light blocking parts surrounding each of the plurality of color filters on the insulating layer. The touch electrode may be covered by the insulating layer.

The display device may further comprise an encapsulation layer disposed on the pixel defining layer, the pixel electrode, and the spacers. The touch electrode may be disposed on the encapsulation layer.

According to an embodiment of the disclosure, a display device comprises a first substrate, a thin film transistor layer disposed on the first substrate and including a plurality of thin film transistors, a pixel defining layer disposed on the thin film transistor layer and defining a plurality of emission areas, a pixel electrode disposed in the emission area on the thin film transistor layer, a plurality of spacers disposed on the pixel defining layer, and a touch electrode disposed on the plurality of spacers and configured to receive an input from an outside. The plurality of spacers include a first spacer distinguished from the pixel defining layer and the pixel electrode with respect to light of a specific wavelength, and a second spacer formed of the same material as the pixel defining layer.

The display device may further comprise a code pattern having position information determined by a planar shape of the first spacer.

The plurality of spacers may be regularly arranged in plan view, and first spacers among the plurality of spacers may be irregularly arranged in plan view to form the code pattern.

The first spacer may absorb light of the specific wavelength, and the second spacer, the pixel defining layer, and the pixel electrode may transmit or reflect light of the specific wavelength.

The display device may further comprise a second substrate disposed on the plurality of spacers and supported by the plurality of spacers. The touch electrode may be disposed on the second substrate.

The display device may further comprise an encapsulation layer disposed on the pixel defining layer, the pixel electrode, and the spacer. The touch electrode may be disposed on the encapsulation layer.

According to an embodiment of the disclosure, a display device comprises a first substrate, a thin film transistor layer disposed on the first substrate and including a plurality of thin film transistors, a pixel defining layer disposed on the thin film transistor layer and defining a plurality of emission areas, a pixel electrode disposed in each of the emission areas on the thin film transistor layer, a plurality of spacers disposed on the pixel defining layer, and a coating pattern disposed on at least some of the plurality of spacers. A touch electrode disposed on the plurality of spacers and the coating pattern and configured to receive an input from an outside.

The display device may further comprise a code pattern having position information determined by a planar shape of the coating pattern.

The plurality of spacers may be regularly arranged in plan view, and the coating pattern may be irregularly arranged in plan view to form the code pattern.

The coating pattern may absorb light of a specific wavelength, and the spacer, the pixel defining layer, and the pixel electrode may transmit or reflect light of the specific wavelength.

According to an embodiment of the disclosure, a sensing system comprises a display device configured to display an image, and an input device configured to approach or be brought into contact with the display device to perform an input to the display device. The display device comprises a first substrate, a thin film transistor layer disposed on the first substrate and including a plurality of thin film transistors, a pixel defining layer disposed on the thin film transistor layer and defining a plurality of emission areas, a pixel electrode disposed in each of the emission areas on the thin film transistor layer, a plurality of spacers disposed on the pixel defining layer and distinguished from the pixel defining layer and the pixel electrode with respect to light of a specific wavelength, a touch electrode disposed on the plurality of spacers and configured to receive an input from an outside, and a code pattern having position information determined by a planar shape of each of the plurality of spacers. The input device captures an image of the code pattern, converts the code pattern into a preset data code, and transmits coordinate data composed of the data codes to the display device.

The input device may comprise a camera configured to capture an image of the code pattern, a processor configured to analyze the image of the code pattern, convert the code pattern into a preset data code, and generate coordinate data composed of the data codes, and a communication module configured to transmit the coordinate data to the display device.

In the display device and the sensing system including the same according to embodiments, the display device may include a spacer distinguished from a pixel electrode and a pixel defining layer, and a plurality of code patterns determined by the planar shape of the spacer, thereby receiving an input from the input device such as an input pen. At least one code pattern or a combination of code patterns may have position information according to a specific criterion, and may correspond to a preset data code one-to-one. Accordingly, the display device and the sensing system including the same may generate coordinate data composed of data codes without complex calculation and correction, thereby performing a corresponding function by accurate input coordinates, reducing cost and power consumption, and simplifying a driving process. In addition, the display device and the sensing system including the same may include a code pattern formed of a spacer that maintains a distance between a light emitting element and an upper substrate, and thus may not be limited in size and may be applied to all electronic devices.

However, the effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
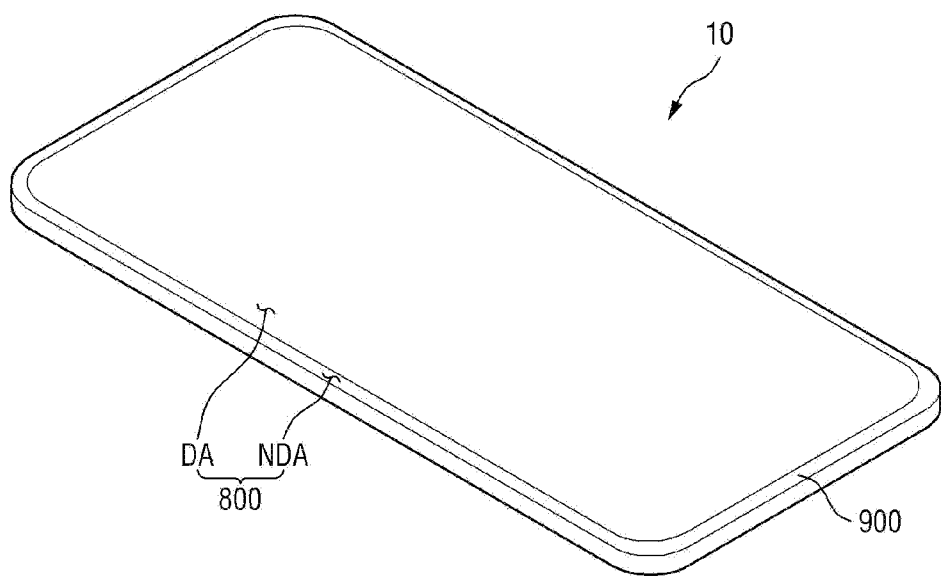
FIG. 1 is a perspective view showing a display device according to one embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the present disclosure will be described with reference to the accompanying drawings.

FIG. 1 is a perspective view showing a display device according to one embodiment.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. For example, the display device 10 may be applied as a display unit of a television, a laptop, a monitor, a billboard, or an Internet-of-Things (IoT) device. For another example, the display device 10 may be applied to wearable devices such as a smart watch, a watch phone, a glasses type display, or a head mounted display (HMD).

The display device 10 may have a planar shape similar to a quadrilateral shape. For example, the display device 10 may have a shape similar to a quadrilateral shape, in a plan view, having short sides in an X-axis direction and long sides in a Y-axis direction. The corner where the short side in the X-axis direction and the long side in the Y-axis direction meet may be rounded to have a predetermined curvature or may be right-angled. The planar shape of the display device 10 is not limited to a quadrilateral shape, and may be formed in a shape similar to another polygonal shape, a circular shape, or elliptical shape.

The display device 10 may include a cover window 800 and a lower cover 900.

The cover window 800 may be disposed on the display panel to cover the top surface of the display panel. The cover window 800 may protect the top surface of the display panel.

The cover window 800 may include a display area DA for displaying an image of the display panel and a non-display area NDA which is disposed around the display area DA. The display area DA may emit light from a plurality of emission areas or a plurality of opening areas of the display panel. The non-display area NDA may be formed to be opaque so that unnecessary components other than the image of the display panel are not recognized by a user. For example, the cover window 800 may be made of glass, sapphire, or plastic, but is not limited thereto. The cover window 800 may be rigid or flexible.

The lower cover 900 may be disposed under the display panel. The lower cover 900 may form an external appearance of the bottom surface of the display device 10. The bottom cover 900 may be formed in a bowl shape to accommodate the display panel. The sidewalls of the bottom cover 900 may be in contact with edges of the cover window 800. In this case, the sidewalls of the bottom cover 900 may be bonded to the edges of the cover window 800 through an adhesive. The bottom cover 900 may include plastic or metal. The bottom cover 900 may include steel use stainless (SUS) or aluminum (Al) to increase a heat dissipation effect.

Figure 2:
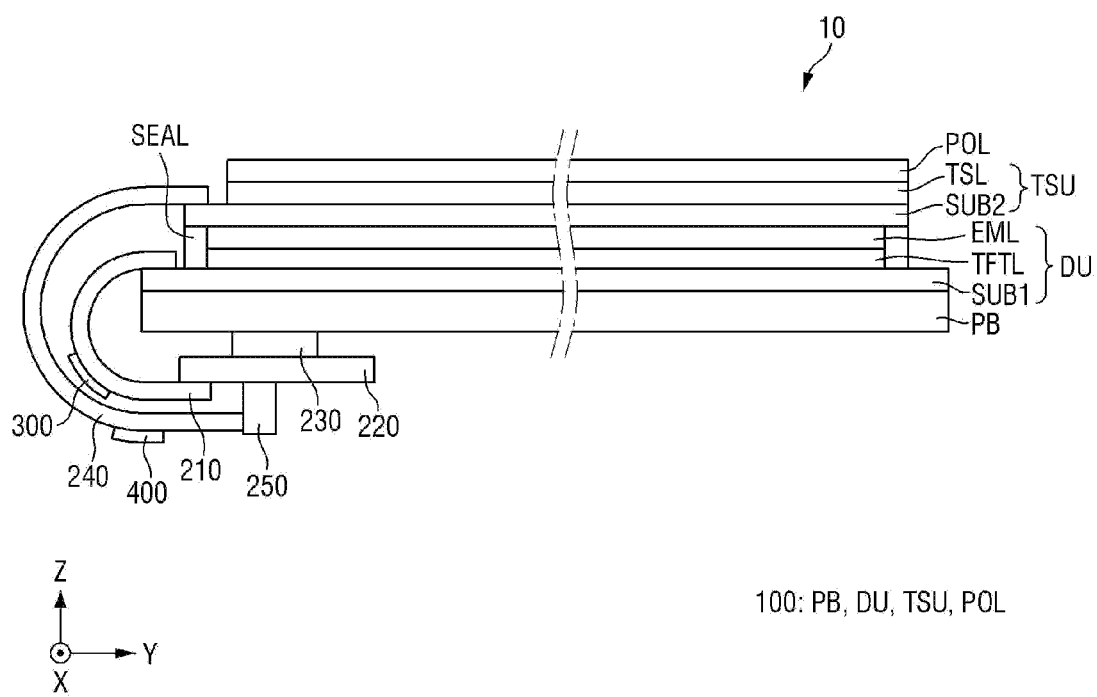
FIG. 2 is a cross-sectional view illustrating a display device according to one embodiment.

FIG. 2 is a cross-sectional view illustrating a display device according to one embodiment.

Referring to FIG. 2, the display device 10 may include a display panel 100, a first flexible film 210, a circuit board 220, an adhesive member 230, a second flexible film 240, a connector 250, a display driver 300, and a touch driver 400.

The display panel 100 may include a display unit DU, a touch sensing unit TSU, a polarizing film POL, and a panel lower cover PB. The display unit DU may include a first substrate SUB1, a thin film transistor layer TFTL, and a light emitting element layer EML.

The first substrate SUB1 may be a base substrate or a base member. For example, the first substrate SUB1 may be a rigid substrate. The first substrate SUB1 may include a glass material or a metal material, but is not limited thereto. For another example, the first substrate SUB1 may be a flexible substrate which can be bent, folded and rolled. The first substrate SUB1 may include an insulating material such as a polymer resin such as polyimide (PI).

The thin film transistor layer TFTL may be disposed on the first substrate SUB1. The thin film transistor layer TFTL may include a plurality of thin film transistors constituting a pixel circuit of pixels. The thin film transistor layer TFTL may further include gate lines, data lines, power lines, gate control lines, fan-out lines that connect the display driver 300 to the data lines, and lead lines that connect the display driver 300 to the pad unit. Each of the thin film transistors may include a semiconductor region, a source electrode, a drain electrode, and a gate electrode. For example, when the gate driver is formed on one side of the non-display area NDA of the display panel 100, the gate driver may include thin film transistors.

The thin film transistor layer TFTL may be disposed in the display area DA and the non-display area NDA. Thin film transistors, gate lines, data lines, and power lines of each of the pixels of the thin film transistor layer TFTL may be disposed in the display area DA. The gate control lines, the fan-out lines, and the lead lines of the thin film transistor layer TFTL may be disposed in the non-display area NDA.

The light emitting element layer EML may be disposed on the thin film transistor layer TFTL. The light emitting element layer EML may include a plurality of light emitting elements in which a first electrode, a light emitting layer, and a second electrode are sequentially stacked to emit light, and a pixel defining layer defining pixels. A plurality of light emitting elements of the light emitting element layer EML may be disposed in the display area DA.

For example, the light emitting layer may be an organic light emitting layer including an organic material. The light emitting layer may include a hole transporting layer, an organic light emitting layer, and an electron transporting layer. When the first electrode receives a predetermined voltage through the thin film transistor of the thin film transistor layer TFTL and the second electrode receives the common voltage, holes and electrons may be transferred to the organic light emitting layer through the hole transporting layer and the electron transporting layer, respectively and may be combined with each other to emit light in the organic light emitting layer. For example, the first electrode may be an anode electrode, and the second electrode may be a cathode electrode, but the present disclosure is not limited thereto.

For another example, the plurality of light emitting elements may include a quantum dot light emitting diode including a quantum dot light emitting layer, an inorganic light emitting diode including an inorganic semiconductor, or a micro light emitting diode.

A sealing member SEAL may be disposed at an edge between the first substrate SUB1 and a second substrate SUB2 to bond the first substrate SUB1 with the second substrate SUB2. The sealing member SEAL may surround the thin film transistor layer TFTL and the light emitting element layer EML. The sealing member SEAL may be a frit adhesive layer, an ultraviolet curing resin, or a thermosetting resin, but is not limited thereto.

The touch sensing unit TSU may include a second substrate SUB2, and a touch sensor layer TSL. For example, the touch sensing unit TSU may be separately fabricated and attached to the display unit DU, but is not limited thereto.

The second substrate SUB2 may be disposed on the light emitting element layer EML. The second substrate SUB2 may be a base substrate or a base member, and may support the touch sensor layer TSL. The second substrate SUB2 may be a base member that encapsulates the display unit DU. For example, the second substrate SUB2 may be a rigid substrate. The second substrate SUB2 may include a glass material or a metal material, but is not limited thereto. For another example, the second substrate SUB2 may include an insulating material such as a polymer resin such as polyimide (PI).

The touch sensor layer TSL may be disposed on the second substrate SUB2. The touch sensor layer TSL may include a plurality of touch electrodes for sensing a user's touch in a capacitive manner, and touch lines connecting the plurality of touch electrodes to the touch driver 400. For example, the touch sensor layer TSL may sense the user's touch by using a mutual capacitance method or a self-capacitance method.

The polarizing film POL may be disposed on the touch sensing unit TSU. The polarizing film POL may be attached onto the touch sensing unit TSU by an optically clear adhesive (OCA) film or an optically clear resin (OCR). For example, the polarizing film POL may include a phase retardation film such as a linear polarizer plate and a quarter-wave ($\lambda$/4) plate. The phase retardation film and the linear polarizer plate may be sequentially stacked on the touch sensing unit TSU.

The panel lower cover PB may be disposed in the lower portion of the display panel 100. The panel lower cover PB may be attached to the bottom surface of the display panel 100 through an adhesive. The adhesive may be a pressure sensitive adhesive (PSA). The lower panel cover PB may include at least one of a light blocking part for absorbing light incident from the outside, a buffer member for absorbing an impact from the outside, or a heat dissipation member for efficiently dissipating heat from the display panel 100.

The first flexible film 210 may be attached onto a display pad portion of the display unit DU using an anisotropic conductive film (ACF). The first flexible film 210 may mount the display driver 300. Lead lines of the first flexible film 210 may be electrically connected to the display pad portion of the display unit DU. The first flexible film 210 may be a flexible printed circuit board, a printed circuit board, or a chip on film.

The circuit board 220 may support the connector 250 and supply a signal and power to the display driver 300 and the touch driver 400. For example, the circuit board 220 may supply a signal supplied from a timing controller (not shown) and power supplied from a power supply unit (not shown) to the display driver 300 and the touch driver 400. The circuit board 220 may supply a signal for synchronizing the display driver 300 and the touch driver 400. Accordingly, signal lines and power lines may be provided on the circuit board 220.

The adhesive member 230 may attach the circuit board 220 to the bottom surface of the panel lower cover PB. Accordingly, the circuit board 220 may be supported by the panel lower cover PB. The adhesive member 230 may be a pressure sensitive adhesive (PSA).

The second flexible film 240 may be attached onto a touch pad portion of the touch sensing unit TSU using an anisotropic conductive film (ACF). The second flexible film 240 may mount the touch driver 400. Lead lines of the second flexible film 240 may be electrically connected to the touch pad portion of the touch sensing unit TSU. The second flexible film 240 may be a flexible printed circuit board, a printed circuit board, or a chip on film.

The connector 250 may connect the circuit board 220 to the second flexible film 240. The touch driver 400 may be electrically connected to the circuit board 220 through the second flexible film 240 and the connector 250. Accordingly, the touch driver 400 may receive a signal from the circuit board 220 to be synchronized with the display driver 300.

The display driver 300 may output signals and voltages for driving the display unit DU. The display driver 300 may supply data voltages to data lines. The data voltage may be supplied to the plurality of pixels to determine the luminance of the plurality of pixels. The display driver 300 may supply a power voltage to the power line and may supply a gate control signal to the gate driver. The display driver 300 may be formed of an integrated circuit (IC) and mounted on the first flexible film 210 by a chip on film method or a tape carrier package method. For another example, the display driver 300 may be mounted on the circuit board 220.

The touch driver 400 may output signals and voltages for driving the touch sensing unit TSU. The touch driver 400 may be formed of an integrated circuit (IC) and mounted on the second flexible film 240 by a chip on film method or a tape carrier package method. The touch driver 400 may supply a driving signal to a plurality of touch electrodes of the touch sensing unit TSU and may sense an amount of change in capacitance between the plurality of touch electrodes. For example, the driving signal may be a pulse signal having a predetermined frequency. The touch driver 400 may calculate whether an input is made and input coordinates based on an amount of change in capacitance between the plurality of touch electrodes.

Figure 3:
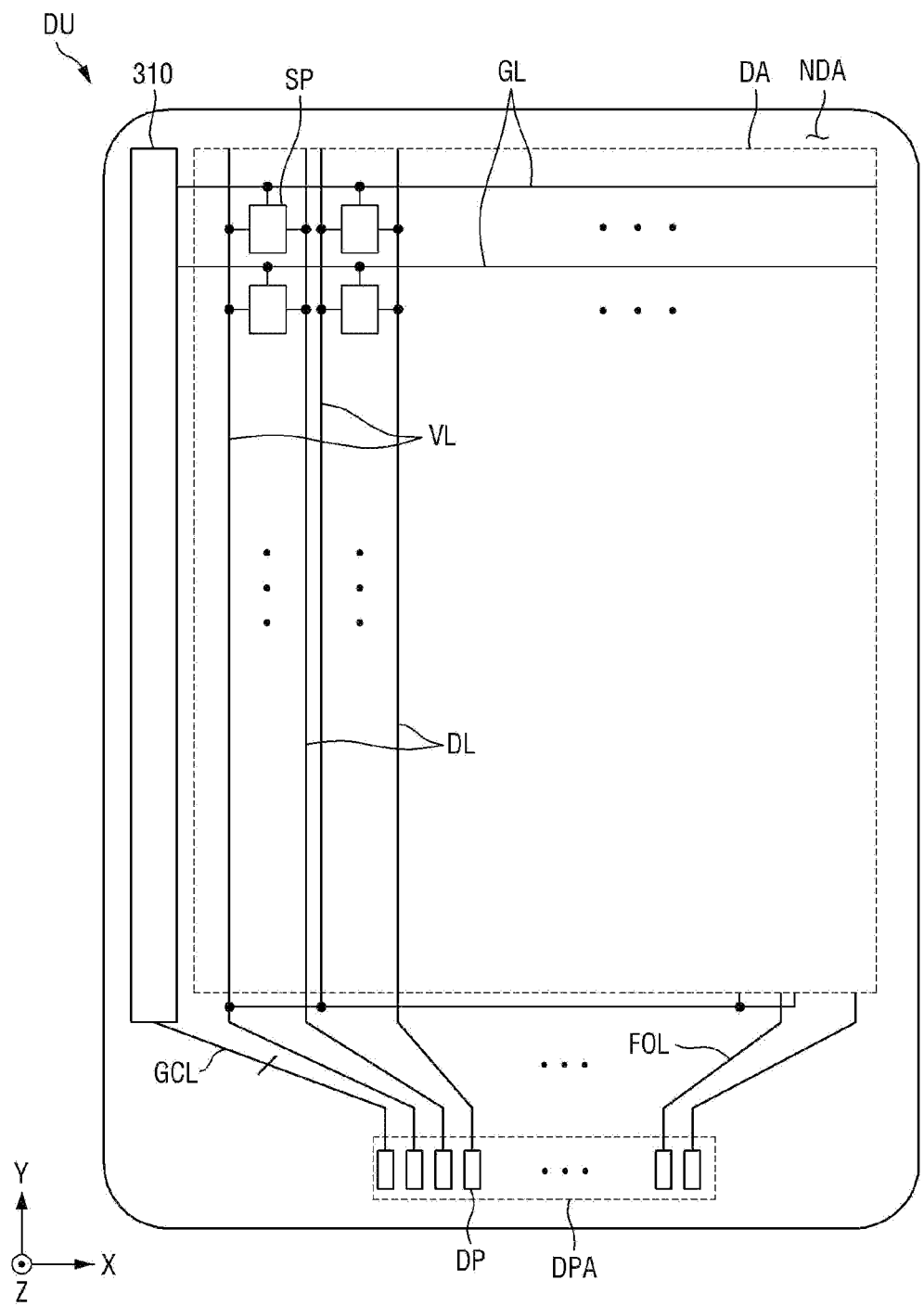
FIG. 3 is a plan view illustrating a display unit of a display device according to one embodiment.

FIG. 3 is a plan view illustrating a display unit of a display device according to one embodiment.

Referring to FIG. 3, the display unit DU may include the display area DA and the non-display area NDA.

The display area DA, which is an area for displaying an image, may be defined as the central area of the display panel 100. The display area DA may include a plurality of pixels SP, a plurality of gate lines GL, a plurality of data lines DL, and a plurality of power lines VL. Each of the plurality of pixels SP may be defined as the smallest unit that outputs light.

The plurality of gate lines GL may supply the gate signals received from the gate driver 310 to the plurality of pixels SP. The plurality of gate lines GL may extend in the X-axis direction and may be spaced apart from each other in the Y-axis direction that crosses the X-axis direction.

The plurality of data lines DL may supply the data voltages received from the display driver 300 to the plurality of pixels SP. The plurality of data lines DL may extend in the Y-axis direction and may be spaced apart from each other in the X-axis direction.

The plurality of power lines VL may supply the power voltage received from the display driver 300 to the plurality of pixels SP. Here, the power voltage may be at least one of a driving voltage, an initialization voltage, a reference voltage, or a common voltage. The plurality of power lines VL may extend in the Y-axis direction and may be spaced apart from each other in the X-axis direction.

The non-display area NDA may surround the display area DA. The non-display area NDA may include the gate driver 310, fan-out lines FOL, gate control lines GCL, and a display pad area DPA. The gate driver 310 may generate a plurality of gate signals based on the gate control signal, and may sequentially supply the plurality of gate signals to the plurality of gate lines GL according to a set order.

The fan-out lines FOL may extend from a display pad portion DP to the display area DA. The fan-out lines FOL may supply the data voltage received from the display driver 300 to the plurality of data lines DL.

The gate control line GCL may extend from the display pad portion DP to the gate driver 310. The gate control line GCL may supply the gate control signal received from the display driver 300 to the gate driver 310.

The display pad area DPA may be disposed at the edge of the non-display area NDA. The display pad area DPA may be electrically connected to the first flexible film 210 by using an anisotropic conductive film or a low-resistance high-reliability material such as self assembly anisotropic conductive paste (SAP). The display pad area DPA may include a plurality of display pad portions DP. The plurality of display pad portions DP may be connected to a graphic system through the first flexible film 210 and the circuit board 220. The plurality of display pad portions DP may receive the data voltage from the display driver 300.

Figure 4:
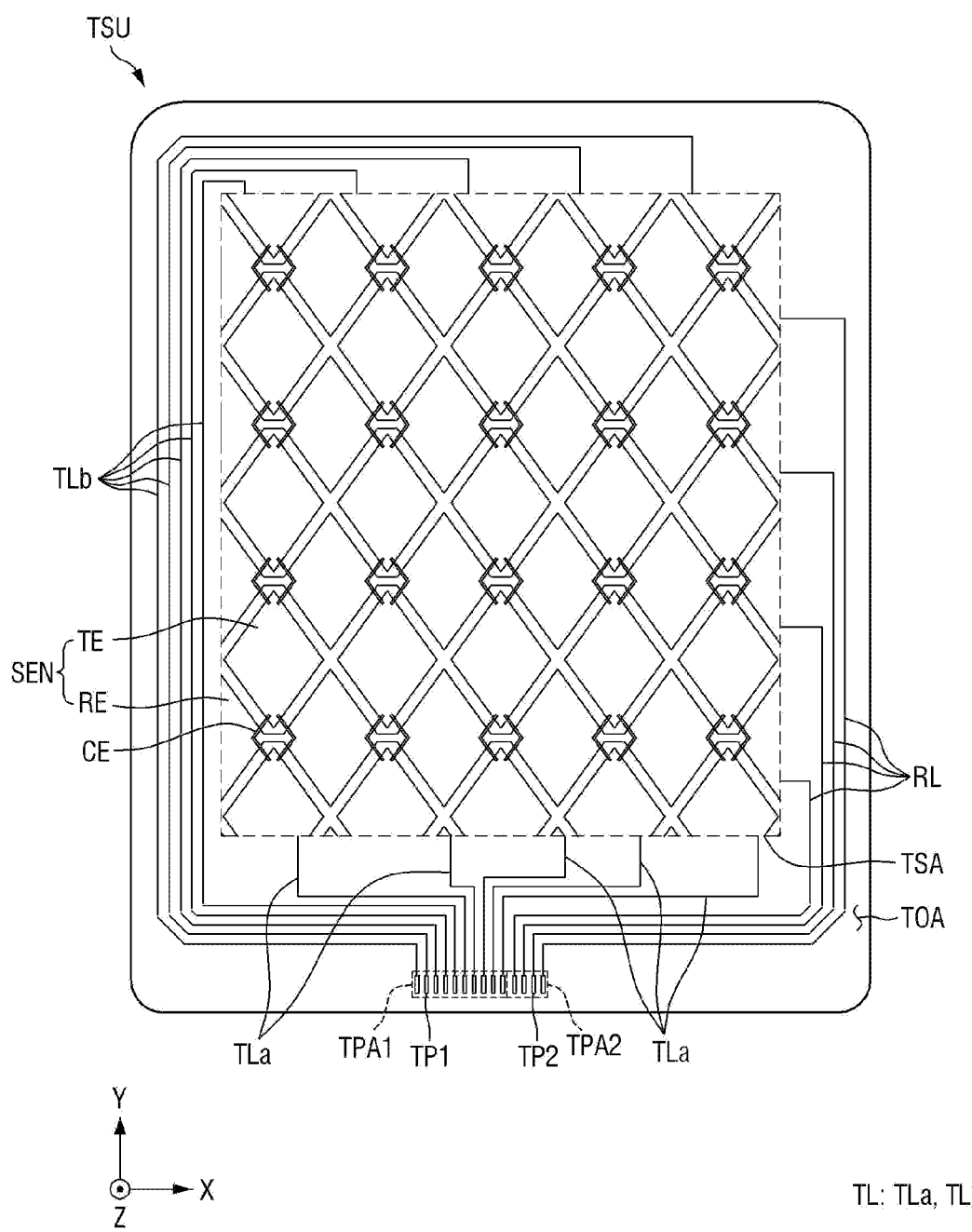
FIG. 4 is a plan view illustrating a touch sensing unit of a display device according to one embodiment.

FIG. 4 is a plan view illustrating a touch sensing unit of a display device according to one embodiment.

Referring to FIG. 4, the touch sensing unit TSU may include a touch sensor area TSA for sensing a user's touch, and a touch peripheral area TOA which is disposed around the touch sensor area TSA. The touch sensor area TSA may overlap the display area DA of the display unit DU, and the touch peripheral area TOA may overlap the non-display area NDA of the display unit DU.

The touch sensor area TSA may include a plurality of touch electrodes SEN. The plurality of touch electrodes SEN may form mutual capacitance or self-capacitance to sense a touch of an object or a person. The plurality of touch electrodes SEN may be connected to the touch driver 400 through the touch line. The plurality of touch electrodes SEN may include a plurality of driving electrodes TE and a plurality of sensing electrodes RE. The touch line may include a driving line TL connected to the driving electrode TE and a sensing line RL connected to the sensing electrode RE.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent in the Y-axis direction may be electrically connected through a bridge electrode CE.

The plurality of driving electrodes TE may be connected to a first touch pad portion TP1 through a driving line TL. The driving line TL may include a lower driving line TLa and an upper driving line TLb. For example, the driving electrodes TE disposed under the touch sensor area TSA may be connected to the first touch pad portion TP1 through the lower driving line TLa, and the driving electrodes TE disposed on the upper side of the touch sensor area TSA may be connected to the first touch pad portion TP1 through the upper driving line TLb. The lower driving line TLa may extend to the first touch pad portion TP1 through the lower side of the touch peripheral area TOA. The upper driving line TLb may extend to the first touch pad portion TP1 through the upper side, the left side, and the lower side of the touch peripheral area TOA. The first touch pad portion TP1 may be connected to the touch driver 400 through the second flexible film 240.

The bridge electrode CE may be bent at least once. For example, the bridge electrode CE may have an angle bracket shape ("<" or ">"), but the planar shape of the bridge electrode CE is not limited thereto. The driving electrodes TE adjacent to each other in the Y-axis direction may be connected by a plurality of bridge electrodes CE, and although any one of the bridge electrodes CE is disconnected, the driving electrodes TE may be stably connected through the remaining bridge electrode CE. The driving electrodes TE disposed adjacent to each other may be connected by two bridge electrodes CE, but the number of bridge electrodes CE is not limited thereto.

The bridge electrode CE may be disposed on a different layer from the plurality of driving electrodes TE and the plurality of sensing electrodes RE. The sensing electrodes RE disposed adjacent to each other in the X-axis direction may be electrically connected through a connection portion disposed on the same layer as the plurality of driving electrodes TE or the plurality of sensing electrodes RE. Further, the driving electrodes TE disposed adjacent in the Y-axis direction may be electrically connected through the bridge electrode CE disposed on a different layer from the plurality of driving electrodes TE or the plurality of sensing electrodes RE. Accordingly, although the bridge electrode CE overlaps the plurality of sensing electrodes RE in the Z-axis direction, the plurality of driving electrodes TE and the plurality of sensing electrodes RE may be insulated from each other. Mutual capacitance may be formed between the driving electrode TE and the sensing electrode RE.

The plurality of sensing electrodes RE may extend in the X-axis direction and may be spaced apart from each other in the Y-axis direction. The plurality of sensing electrodes RE may be arranged in the X-axis direction and the Y-axis direction. Further, the sensing electrodes RE disposed adjacent in the X-axis direction may be electrically connected through a connection portion.

The plurality of sensing electrodes RE may be connected to the second touch pad portion TP2 through a sensing line RL. For example, the sensing electrodes RE disposed adjacent the right side of the touch sensor area TSA may be connected to the second touch pad portion TP2 through the sensing line RL. The sensing line RL may extend to the second touch pad portion TP2 through the right side and the lower side of the touch peripheral area TOA. The second touch pad portion TP2 may be connected to the touch driver 400 through the second flexible film 240.

First and second touch pad areas TPA1 and TPA2 may be disposed at the edges of the touch peripheral area TOA. The first and second touch pad areas TPA1 and TPA2 may be electrically connected to the second flexible film 240 by using an anisotropic conductive film or a low-resistance high-reliability material such as self assembly anisotropic conductive paste (SAP).

The first touch pad area TPA1 may include a plurality of first touch pad portions TP1. The second touch pad area TPA2 may include a plurality of second touch pad portions TP2. The first and second touch pad portions TP1 and TP2 may be electrically connected to the touch driver 400 disposed on the second flexible film 240. The first touch pad portion TP1 may supply a driving signal to the driving electrode TE through the driving line TL. The second touch pad portion TP2 may supply a sensing signal received from the sensing line RL to the touch driver 400, and the touch driver 400 may sense a change in mutual capacitance between the driving electrode TE and the sensing electrode RE.

For another example, the touch driver 400 may supply a driving signal to each of the plurality of driving electrodes TE and the plurality of sensing electrodes RE, and may receive a sensing signal from each of the plurality of driving electrodes TE and the plurality of sensing electrodes RE. The touch driver 400 may sense an amount of change in electric charge of each of the plurality of driving electrodes TE and the plurality of sensing electrodes RE based on the sensing signal.

Figure 5:
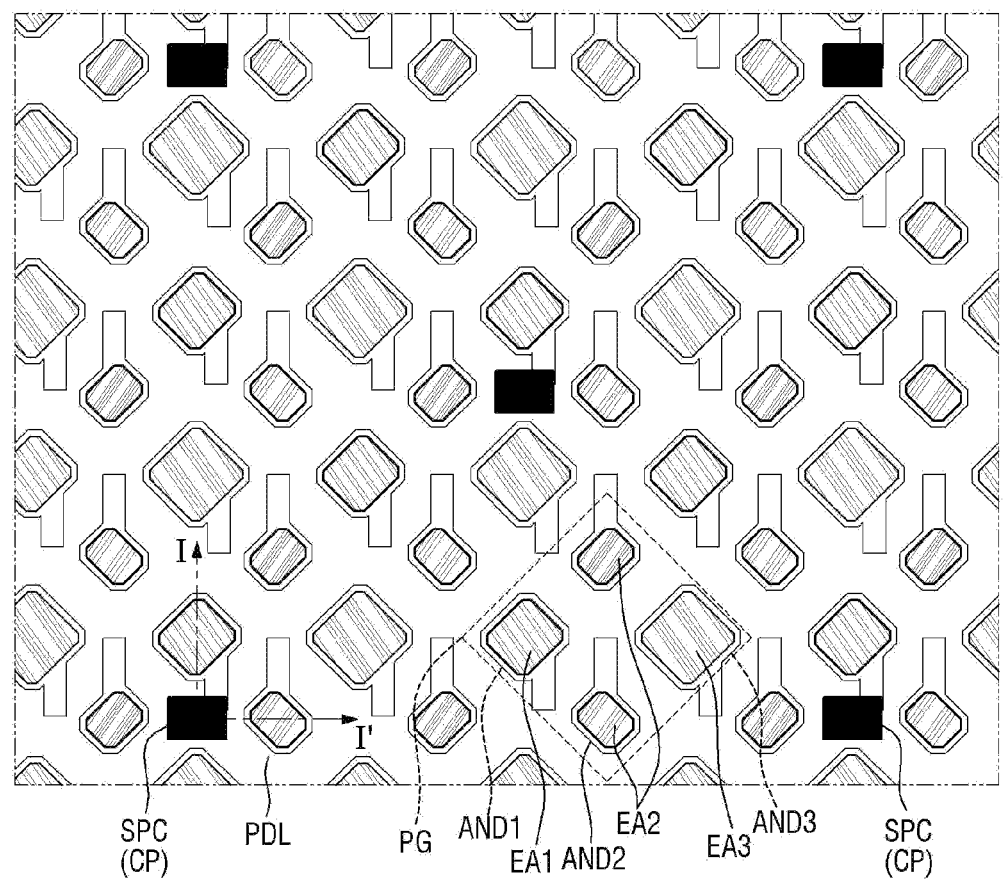
FIG. 5 is a plan view illustrating a display area of a display device according to one embodiment.
Figure 5:
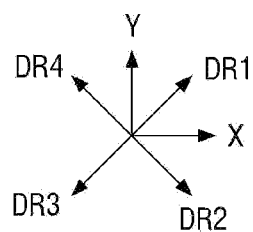
Figure 6:
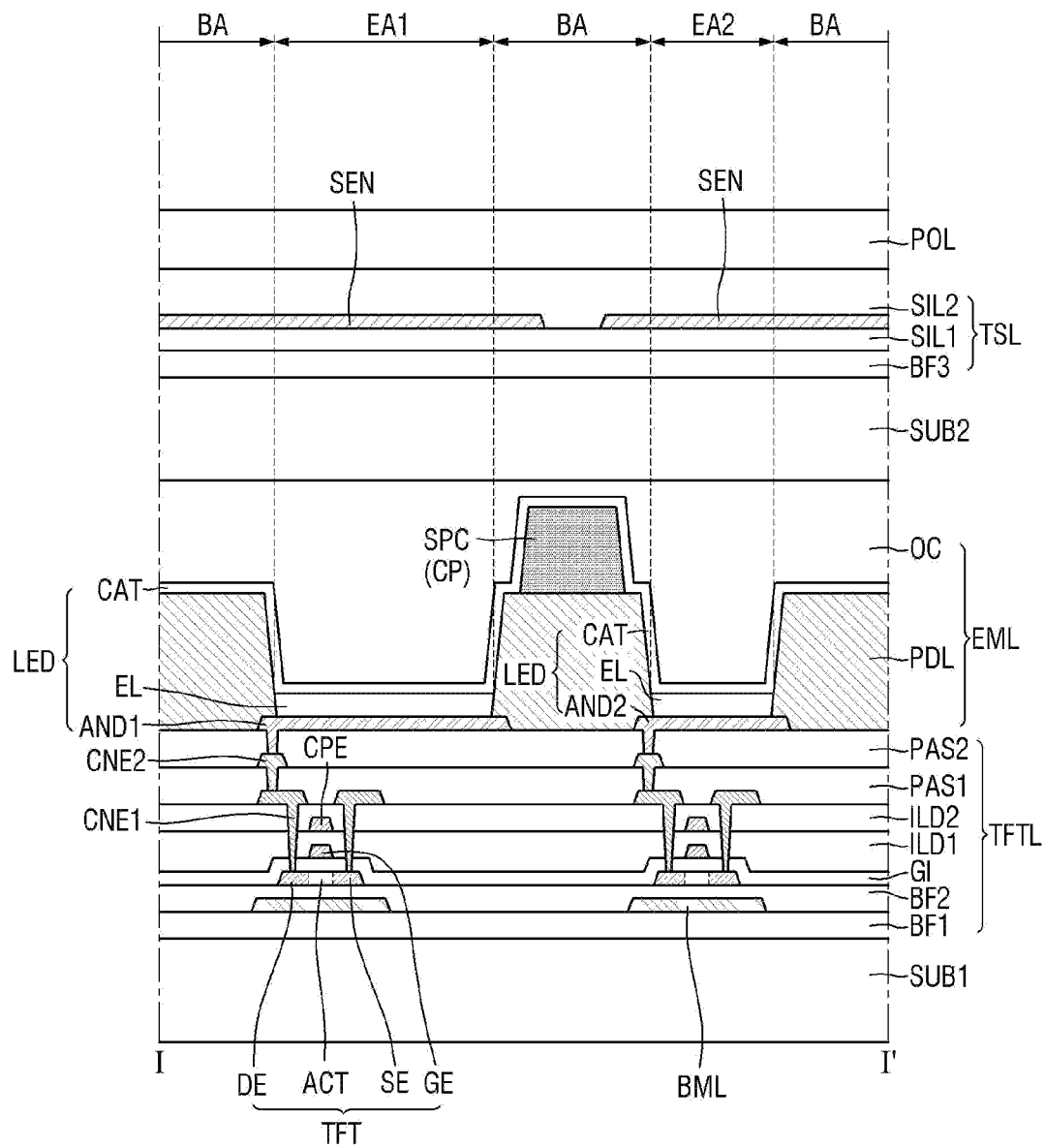
FIG. 6 is a cross-sectional view taken along line I-I' of FIG. 5.

FIG. 5 is a plan view illustrating a display area of a display device according to one embodiment. FIG. 6 is a cross-sectional view taken along line I-I' of FIG. 5.

Referring to FIGS. 5 and 6, the plurality of pixels may include first, second, and third pixels, and each of the first, second, and third pixels may include first to third emission areas EA1, EA2, and EA3. The first emission area EA1 may emit light of a first color or red light, the second emission area EA2 may emit light of a second color or green light, and the third emission area EA3 may emit light of a third color or blue light, but is not limited thereto. The first to third emission areas EA1, EA2, and EA3 may be different in size from each other. For example, the size of the third emission area EA3 may be larger than that of the first emission area EA1, and the size of the first emission area EA1 may be larger than that of the second emission area EA2. However, the present disclosure is not limited thereto. As another example, the sizes of the first to third emission areas EA1, EA2, and EA3 may be substantially the same.

One pixel group PG may represent white gray scale by including one first emission area EA1, two second emission areas EA2, and one third emission area EA3, but the configuration of the pixel group PG is not limited thereto. The white gray scale may be represented by a combination of light emitted from one first emission area EA1, light emitted from two second emission areas EA2, and light emitted from one third emission area EA3.

The display panel 100 may include a display unit DU, a touch sensing unit TSU, and a polarizing film POL. The display unit DU may include the first substrate SUB1, the thin film transistor layer TFTL, and the light emitting element layer EML.

The first substrate SUB1 may be a base substrate or a base member. For example, the first substrate SUB1 may be a rigid substrate. The first substrate SUB1 may include a glass material or a metal material, but is not limited thereto. For another example, the first substrate SUB1 may be a flexible substrate which can be bent, folded and rolled. The first substrate SUB1 may include an insulating material such as a polymer resin such as polyimide (PI).

The thin film transistor layer TFTL may include a first buffer layer BF1, a light blocking layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the first substrate SUB1. The first buffer layer BF1 may include an inorganic layer capable of preventing penetration of air or moisture. For example, the first buffer layer BF1 may include a plurality of inorganic layers alternately stacked.

A light blocking layer BML may be disposed on the first buffer layer BF1. For example, the light blocking layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. For another example, the light blocking layer BML may be an organic layer including a black pigment.

The second buffer layer BF2 may be disposed on the first buffer layer BF1 and the light blocking layer BML. The second buffer layer BF2 may include an inorganic layer capable of preventing penetration of air or moisture. For example, the second buffer layer BF2 may include a plurality of inorganic layers alternately stacked.

The thin film transistor TFT may be disposed on the second buffer layer BF2, and may constitute a pixel circuit of each of a plurality of pixels. For example, the thin film transistor TFT may be a switching transistor or a driving transistor of the pixel circuit. The thin film transistor TFT may include a semiconductor region ACT, a source electrode SE, a drain electrode DE, and a gate electrode GE.

The semiconductor region ACT, the source electrode SE, and the drain electrode DE may be disposed on the second buffer layer BF2. The semiconductor region ACT, the source electrode SE, and the drain electrode DE may overlap the light blocking layer BML in a thickness direction. The semiconductor region ACT may overlap the gate electrode GE in the thickness direction, and may be insulated from the gate electrode GE by the gate insulating layer GI. The source electrode SE and the drain electrode DE may be provided by making a material of the semiconductor region ACT conductive.

The gate electrode GE may be disposed on the gate insulating layer GI. The gate electrode GE may overlap the semiconductor region ACT with the gate insulating layer GI interposed therebetween.

The gate insulating layer GI may be disposed on the semiconductor region ACT, the source electrode SE, and the drain electrode DE. For example, the gate insulating layer GI may cover the semiconductor region ACT, the source electrode SE, the drain electrode DE, and the second buffer layer BF2, and may insulate the semiconductor region ACT from the gate electrode GE.

The first interlayer insulating layer ILD1 may be disposed on the gate electrode GE and the gate insulating layer GI. One of first connection electrodes CNE1 is disposed on the second interlayer insulating layer ILD2 and contacts the drain electrode DE by a contact hole of penetrating the second interlayer insulating layer ILD2, the gate insulating layer GI, the first interlayer insulating layer ILD2 of the thin film transistor TFT. The other first connection electrode CNE1 is disposed on the second interlayer insulating layer ILD2 and contacts the drain electrode DE by a contact hole of penetrating the second interlayer insulating layer ILD2, the gate insulating layer GI, the first interlayer insulating layer ILD2 of the thin film transistor TFT.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may be disposed on the capacitor electrode CPE and the first interlayer insulating layer ILD1.

The first connection electrode CNE1 may be disposed on the second interlayer insulating layer ILD2. The first connection electrode CNE1 may connect the drain electrode DE of the thin film transistor TFT to the second connection electrode CNE2.

The first passivation layer PAS1 may be disposed on the first connection electrode CNE1 and the second interlayer insulating layer ILD2. The first passivation layer PAS1 may protect the thin film transistor TFT.

The second connection electrode CNE2 may be disposed on the first passivation layer PAS1 and may connect a first pixel electrode AND1 or a second pixel electrode AND2 of a light emitting element LED to the first connection electrode CNE1 through a contact hole penetrating the first passivation layer PAS1.

The second passivation layer PAS2 may cover the second connection electrode CNE2 and the first passivation layer PAS1.

The light emitting element layer EML may be disposed on the thin film transistor layer TFTL. The light emitting element layer EML may include the light emitting element LED, a pixel defining layer PDL, a spacer SPC, and a planarization layer OC. The light emitting element LED may include a pixel electrode, a light emitting layer EL, and a common electrode CAT. The light emitting element LED of the first pixel may include the first pixel electrode AND1, the light emitting layer EL, and the common electrode CAT. The light emitting element LED of the second pixel may include the second pixel electrode AND2, the light emitting layer EL, and the common electrode CAT. The light emitting element LED of the third pixel may include a third pixel electrode AND3, the light emitting layer EL, and the common electrode CAT. For example, the area of the third pixel electrode AND3 may be greater than the area of the first pixel electrode AND1, and the area of the first pixel electrode AND1 may be greater than the area of the second pixel electrode AND2. However, the present disclosure is not limited thereto. As another example, the areas of the first to third pixel electrodes AND1, AND2, and AND3 may be substantially the same. The first to third pixel electrodes AND1, AND2, and AND3 may be formed of the same material on the same layer. The following description will focus on the light emitting element LED of the first pixel.

The first pixel electrode AND1 may be disposed on the second passivation layer PAS2. The first pixel electrode AND1 may be disposed to overlap the first emission area EA1 defined by the pixel defining layer PDL. The first pixel electrode AND1 may be connected to the drain electrode DE of the thin film transistor TFT through the first and second connection electrodes CNE1 and CNE2.

The first pixel electrode AND1 may reflect light of a specific wavelength. The first pixel electrode AND1 may reflect infrared or ultraviolet light. The first pixel electrode AND1 may include an infrared reflective material or an ultraviolet reflective material. For example, the first pixel electrode AND1 may contain at least one of silver (Ag), copper (Cu), aluminum (Al), nickel (Ni), or lanthanum (La).

For another example, the first pixel electrode AND1 may include a material such as indium tin oxide (ITO), indium zinc oxide (IZO), and indium tin zinc oxide (ITZO). As another example, the first pixel electrode AND1 may include a transparent conductive material layer and a metal layer having high reflectivity, or may include one layer including a transparent conductive material and a metal having high reflectivity. For example, the first pixel electrode AND1 may have a stacked structure of ITO/Ag/ITO, ITO/Ag/IZO, ITO/Ag/ITZO/IZO, or the like.

The light emitting layer EL may be disposed on the pixel electrodes AND1 and AND2. For example, the light emitting layer EL may be an organic light emitting layer made of an organic material, but is not limited thereto. In the case of employing the organic light emitting layer as the light emitting layer EL, the thin film transistor TFT applies a predetermined voltage to the pixel electrodes AND1 and AND2 of the light emitting element LED, and if the common electrode CAT of the light emitting element LED receives a common voltage or a cathode voltage, the holes and electrons can move to the light emitting layer EL through the hole transport layer and the electron transport layer and combine to produce light to be emitted by the light emitting layer EL.

The common electrode CAT may be disposed on the light emitting layer EL, the pixel defining layer PDL, and the spacer SPC. For example, the common electrode CAT may be made in the form of an electrode common to all of the pixels rather than specific to each of the pixels. The common electrode CAT may be disposed on the light emitting layer EL in the first to third emission areas EA1, EA2, and EA3, and may be disposed on the pixel defining layer PDL or the spacer SPC in an area other than the first to third emission areas EA1, EA2, and EA3. The common electrode CAT may receive the common voltage or a low potential voltage. When the first pixel electrode AND1 receives a voltage corresponding to a data voltage and the common electrode CAT receives a low potential voltage, a potential difference is formed between the first pixel electrode AND1 and the common electrode CAT, so that the light emitting layer EL may emit light. The common electrode CAT may transmit light of a specific wavelength. The common electrode CAT may transmit infrared or ultraviolet light.

The pixel defining layer PDL may define the first to third emission areas EA1, EA2, and EA3. The pixel defining layer PDL may separate and insulate the first to third pixel electrodes AND1, AND2, and AND3. The pixel defining layer PDL may transmit light. The pixel defining layer PDL may be transparent, but is not limited thereto.

The spacer SPC may be disposed on the pixel defining layer PDL. The spacer SPC may protrude from the top surface of the pixel defining layer PDL toward the second substrate SUB2. The spacers SPC may be irregularly arranged in a plan view to form a code pattern CP. The plurality of spacers SPC may be disposed to be spaced apart from each other by a predetermined distance in a light blocking area BA. The spacer SPC may have a rectangular shape in a plan view, but is not limited thereto and may have other polygonal shapes. The spacer SPC may support the second substrate SUB2. The spacer SPC may maintain a distance between the light emitting element LED and the second substrate SUB2. The spacer SPC may mitigate an impact transmitted to the plurality of pixels and supplement durability of the plurality of pixels. For example, the spacer SPC may include a material having excellent shock absorbency and flexibility to improve the durability of the display device 10.

The spacer SPC may absorb light of a specific wavelength. The spacer SPC may include an infrared absorbing material or an ultraviolet absorbing material. For example, the spacer SPC may include at least one of a diimmonium compound, a polymethine compound, an anthraquinone compound, or a phthalocyanine compound, but is not limited thereto. Accordingly, when the camera captures the spacer SPC using infrared or ultraviolet light, the spacer SPC that absorbs infrared or ultraviolet light may be distinguished from the first to third pixel electrodes AND1, AND2, AND3, the touch electrode SEN, and the pixel defining layer PDL.

For example, the transmittance of the spacer SPC with respect to light of a specific wavelength may be 15% or less. Here, the light of a specific wavelength may have a wavelength of 800 nm to 900 nm, but is not limited thereto. An input device such as an input pen may photograph the spacer SPC using infrared light having a wavelength of 800 nm to 900 nm. When the transmittance of the spacer SPC with respect to light of a specific wavelength is 15% or less, the spacer SPC may be clearly distinguished from the first to third pixel electrodes AND1, AND2, and AND3 that reflect the light of a specific wavelength. When the transmittance of the spacer SPC with respect to light of a specific wavelength exceeds 15%, the spacer SPC may not be clearly distinguished from the first to third pixel electrodes AND1, AND2 and AND3 that reflect the light of a specific wavelength, and the discrimination power of the input device may be reduced. Accordingly, the display device 10 may include the spacer SPC having a transmittance of 15% or less with respect to light having a wavelength of 800 nm to 900 nm, so that the input device such as an input pen may easily identify the code pattern CP formed of the planar shape of the spacer SPC, and the sensing system may improve sensing sensitivity of the input device.

A plurality of code patterns CP may be disposed over the entire display area DA, and each of the plurality of code patterns CP may have position information according to a specific criterion. The code pattern CP may be photographed by a camera approaching the front of the display device 10, and may be identified through a captured picture or image. At least one code pattern CP or a combination of the code patterns CP may correspond to a preset data code value. For example, the code pattern CP disposed at a specific position may correspond to a data code designated at the corresponding position.

The display device 10 may include the spacer SPC distinguished from the first to third pixel electrodes AND1, AND2, and AND3 and the pixel defining layer PDL, and the plurality of code patterns CP determined by the planar shape of the spacer SPC, thereby receiving an input from the input device such as an input pen. At least one code pattern CP or a combination of the code patterns CP may have position information according to a specific criterion, and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP formed of the spacer SPC that maintains a distance between the light emitting element LED and the second substrate SUB2, so that it may not be limited in size and may be applied to all electronic devices having a touch function.

The planarization layer OC may be disposed on the common electrode CAT to cover the plurality of light emitting elements LED. The planarization layer OC may planarize the top end of the light emitting element layer EML. For example, the planarization layer OC may include an organic material to protect the light emitting element layer EML from foreign substances such as dust.

The touch sensing unit TSU may be disposed on the display unit DU. The touch sensing unit TSU may include a second substrate SUB2 and a touch sensor layer TSL.

The second substrate SUB2 may be disposed on the planarization layer OC. The second substrate SUB2 may be a base substrate or a base member, and may support the touch sensor layer TSL. The second substrate SUB2 may be a base member that encapsulates the display unit DU. For example, the second substrate SUB2 may be a rigid substrate. The second substrate SUB2 may include a glass material or a metal material, but is not limited thereto. For another example, the second substrate SUB2 may include an insulating material such as a polymer resin such as polyimide (PI).

The touch sensor layer TSL may be disposed on the second substrate SUB2. The touch sensor layer TSL may include a third buffer layer BF3, a first insulating layer SIL1 the touch electrode SEN, and a second insulating layer SIL2.

The third buffer layer BF3 may be disposed on the second substrate SUB2. The third buffer layer BF3 may have an insulating and optical function. The third buffer layer BF3 may include at least one inorganic layer. Optionally, the third buffer layer BF3 may be omitted.

The first insulating layer SIL1 may be disposed on the third buffer layer BF3. The first insulating layer SIL1 may have an insulating and optical function. For example, the first insulating layer SIL1 may be an inorganic layer containing at least one of a silicon nitride layer, a silicon oxynitride layer, a silicon oxide layer, a titanium oxide layer, or an aluminum oxide layer.

The touch electrode SEN may be disposed on the first insulating layer SIL1. The touch electrode SEN may be a transparent electrode including a transparent conductive material. The touch electrode SEN may transmit light. The touch electrode SEN may include the driving electrode TE and the sensing electrode RE. The touch electrode SEN may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The second insulating layer SIL2 may be disposed on the touch electrode SEN and the first insulating layer SIL1. The second insulating layer SIL2 may have an insulating and optical function. The second insulating layer SIL2 may be made of the material exemplified in association with the first insulating layer SIL1.

The polarizing film POL may be disposed on the touch sensor layer TSL. The polarizing film POL may be attached onto the touch sensor layer TSL by an optically clear adhesive (OCA) film or an optically clear resin (OCR). For example, the polarizing film POL may include a phase retardation film such as a linear polarizer plate and a quarter-wave (λ/4) plate. The phase retardation film and the linear polarizer plate may be sequentially stacked on the touch sensor layer TSL.

Figure 7:
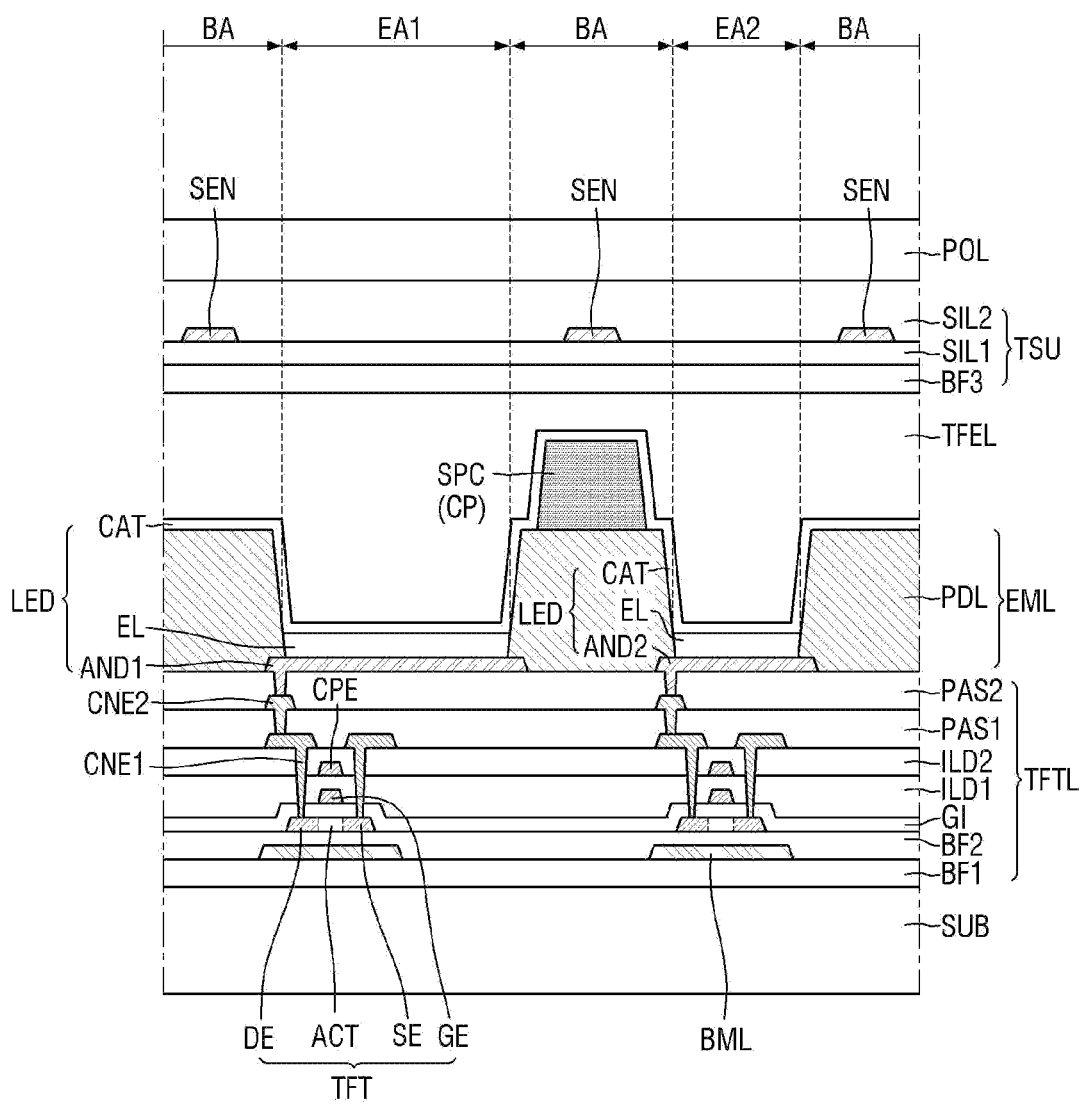
FIG. 7 is a cross-sectional view showing a display device according to another embodiment.

FIG. 7 is a cross-sectional view showing a display device according to another embodiment. The display device of FIG. 7 is different from the display device of FIG. 6 in the configuration of the light emitting element layer EML and the touch sensing unit TSU. A description of the same configuration as the above-described configuration will be briefly given or omitted.

Referring to FIG. 7, the display panel 100 may include a display unit DU, a touch sensing unit TSU, and a polarizing film POL. The display unit DU may include the substrate SUB, the thin film transistor layer TFTL, the light emitting element layer EML, and the encapsulation layer TFEL.

The light emitting element layer EML may be disposed on the thin film transistor layer TFTL. The light emitting element layer EML may include the light emitting element LED, the pixel defining layer PDL, and the spacer SPC.

The spacer SPC may be disposed on the pixel defining layer PDL. The spacer SPC may protrude from the top surface of the pixel defining layer PDL toward the touch sensing unit TSU. The plurality of spacers SPC may be disposed to be spaced apart from each other by a predetermined distance in a light blocking area BA. The spacer SPC may maintain a distance between the first pixel electrode AND1 and a metal mask during the formation of the light emitting layer EL. The spacer SPC may mitigate an impact transmitted to the plurality of pixels and supplement durability of the plurality of pixels. For example, the spacer SPC may include a material having excellent shock absorbency and flexibility to improve the durability of the display device 10. The spacer SPC may absorb light of a specific wavelength. The spacer SPC may include an infrared absorbing material or an ultraviolet absorbing material.

The encapsulation layer TFEL may be disposed on the common electrode CAT to cover the plurality of light emitting elements LED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign matters such as dust.

The touch sensing unit TSU may be disposed on the encapsulation layer TFEL. The touch sensing unit TSU may include a third buffer layer BF3, a first insulating layer SIL1, the touch electrode SEN, and a second insulating layer SIL2.

The third buffer layer BF3 may be disposed on the encapsulation layer TFEL. The third buffer layer BF3 may have an insulating and optical function. The third buffer layer BF3 may include at least one inorganic layer. Optionally, the third buffer layer BF3 may be omitted.

The touch electrode SEN may be disposed on the first insulating layer SIL1. The touch electrode SEN may be a transparent electrode or a reflective electrode. For example, the touch electrode SEN may include a transparent conductive material to transmit light. As another example, the touch electrode SEN may include an infrared reflective material or an ultraviolet reflective material to reflect infrared or ultraviolet light. The touch electrode SEN may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO. The touch electrode SEN may overlap the light blocking area BA, but may not overlap the first to third emission areas EA1, EA2, and EA3.

The touch electrode SEN may be formed in a mesh structure or a net structure in a plan view. The touch electrode SEN may surround each of the first to third emission areas EA1, EA2, and EA3 of the pixel group PG in a plan view. Thus, the touch electrode SEN may not overlap the first to third emission areas EA1, EA2, and EA3. Accordingly, the display device 10 may prevent the luminance of light emitted from the first to third emission areas EA1, EA2, and EA3 from being reduced by the touch sensing unit TSU.

Figure 8:
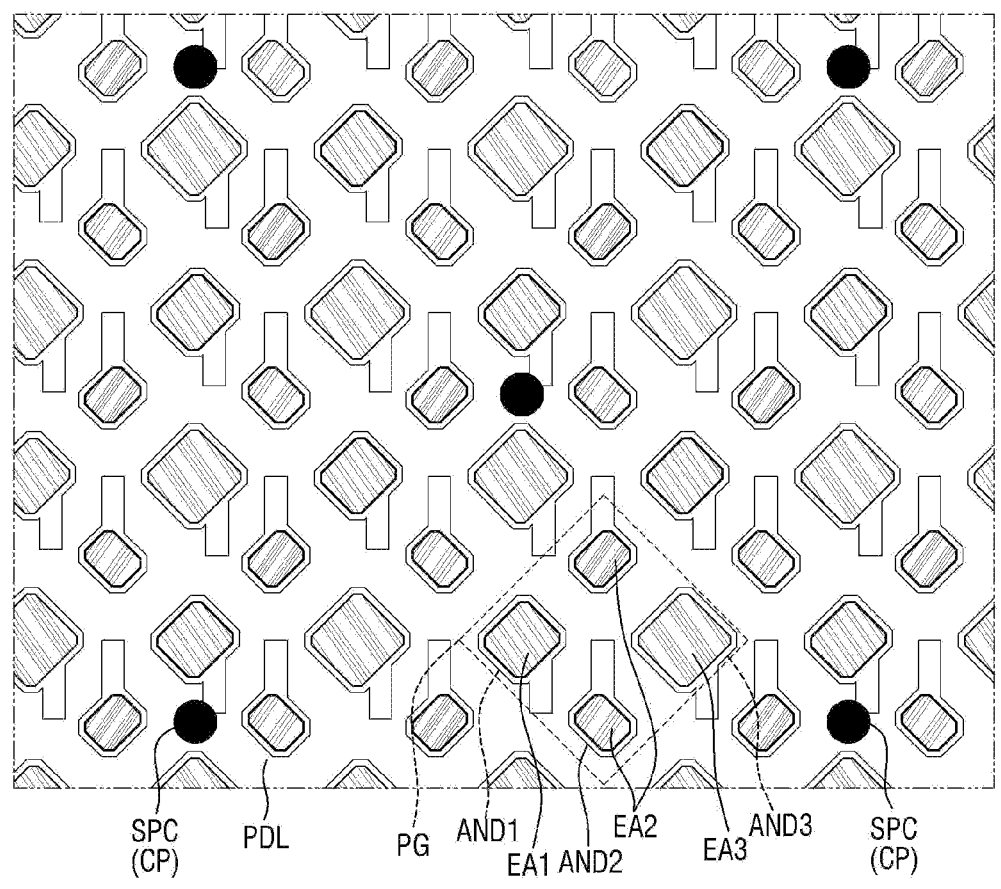
FIG. 8 is a plan view illustrating a display area of a display device according to another embodiment.
Figure 8:
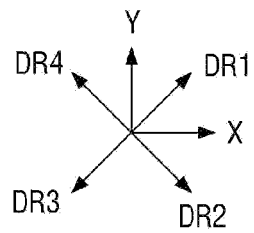
Figure 9:
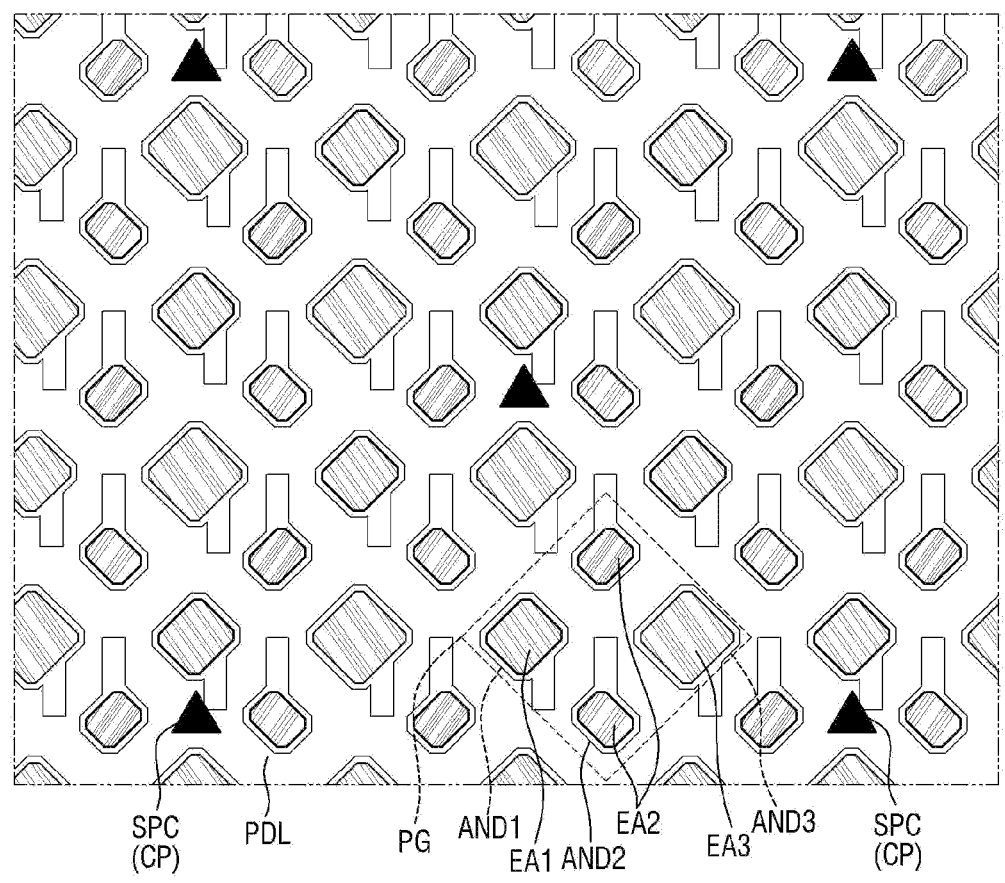
FIG. 9 is a plan view illustrating a display area of a display device according to still another embodiment.
Figure 9:
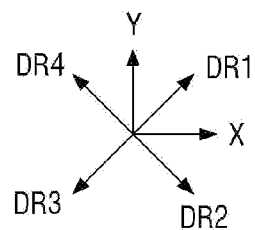
Figure 10:
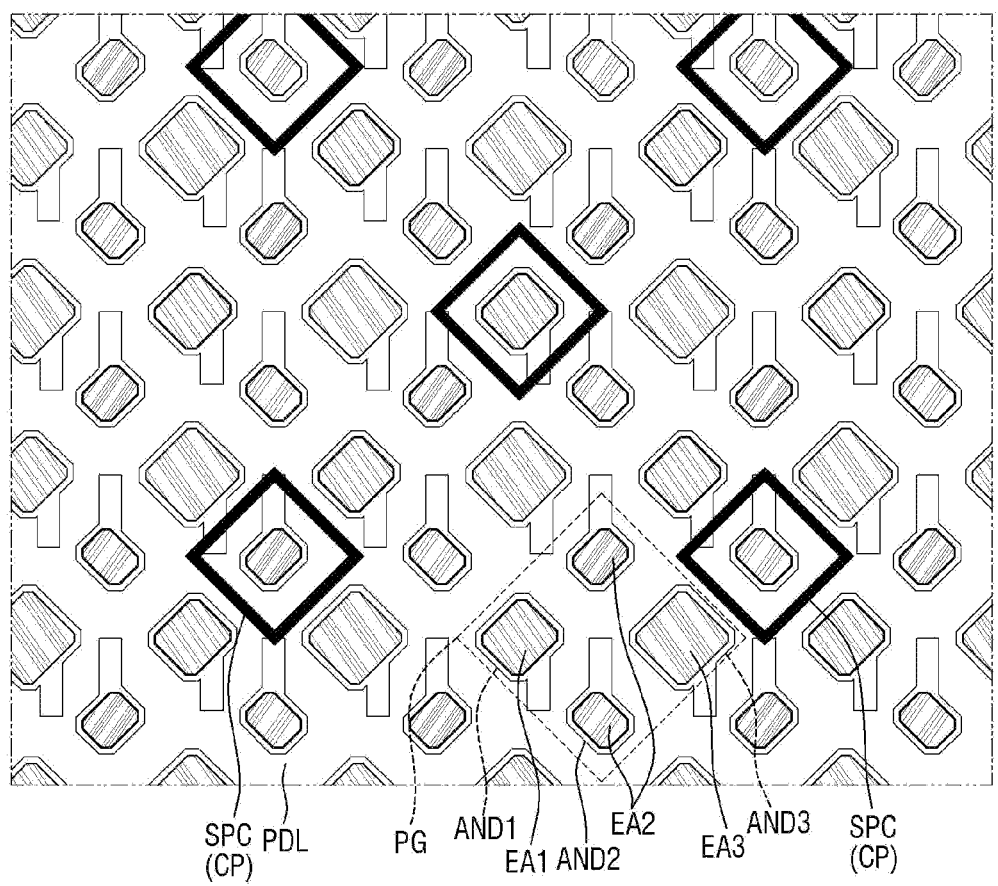
FIG. 10 is a plan view illustrating a display area of a display device according to still another embodiment.
Figure 10:
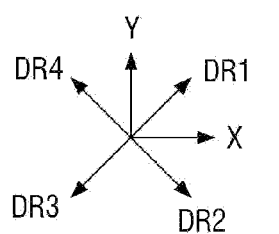
Figure 11:
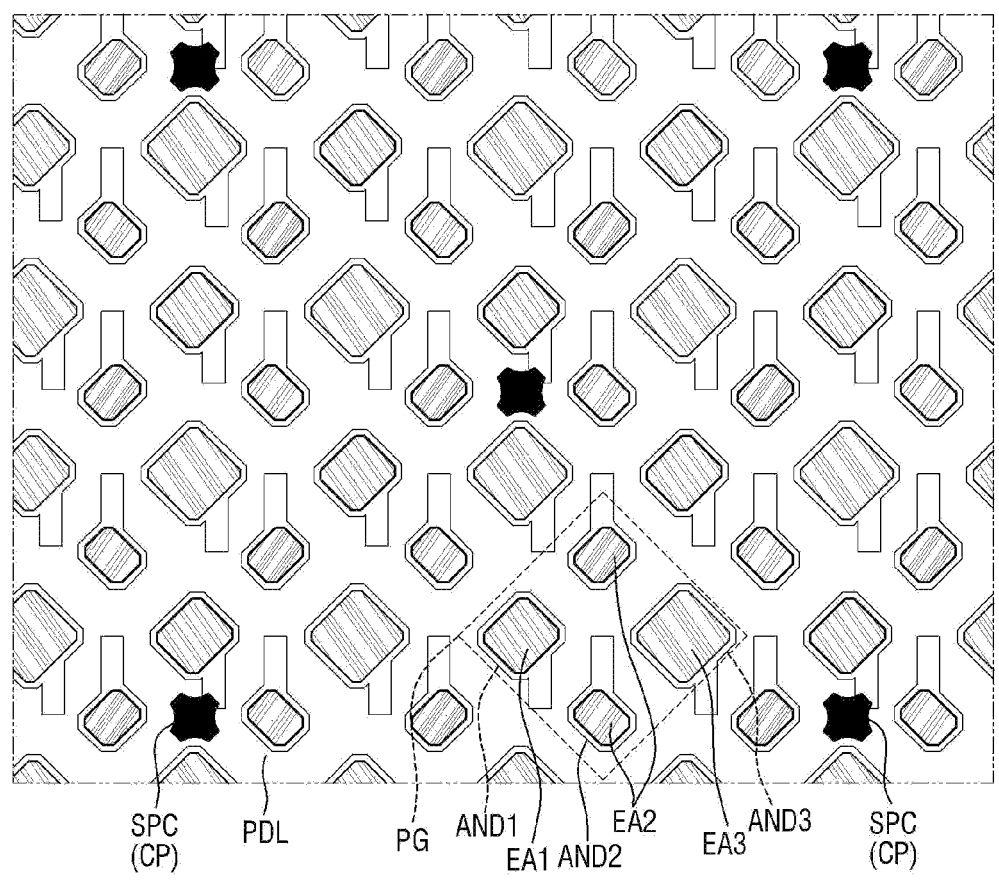
FIG. 11 is a plan view illustrating a display area of a display device according to still another embodiment.
Figure 11:
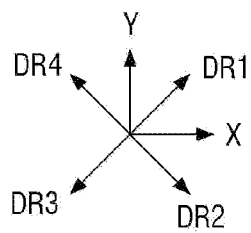

FIG. 8 is a plan view illustrating a display area of a display device according to another embodiment. FIG. 9 is a plan view illustrating a display area of a display device according to still another embodiment. FIG. 10 is a plan view illustrating a display area of a display device according to still another embodiment. FIG. 11 is a plan view illustrating a display area of a display device according to still another embodiment. Each of the display devices of FIGS. 8, 9, 10, and 11 is different from the display device of FIG. 5 in the planar shape of the spacer SPC. A description of the same configuration as the above-described configuration will be briefly given or omitted.

Referring to FIGS. 8, 9, 10, and 11, the spacer SPC may be disposed on the pixel defining layer PDL. The plurality of spacers SPC may be disposed to be spaced apart from each other by a predetermined distance in a light blocking area BA.

In FIG. 8, the spacer SPC may have a circular shape in a plan view, but is not limited thereto and may have an elliptical shape.

In FIG. 9, the spacer SPC may have a triangular shape in a plan view, but is not limited thereto and may have other polygonal shapes.

In FIG. 10, the spacer SPC may have a closed loop shape in a plan view. The spacer SPC may surround at least one of the first to third emission areas EA1, EA2, and EA3 in a plan view.

In FIG. 11, the spacer SPC may have a radial shape in a plan view, but is not limited thereto. The edge of the spacer SPC may be formed in a straight line or a curved line.

Figure 12:
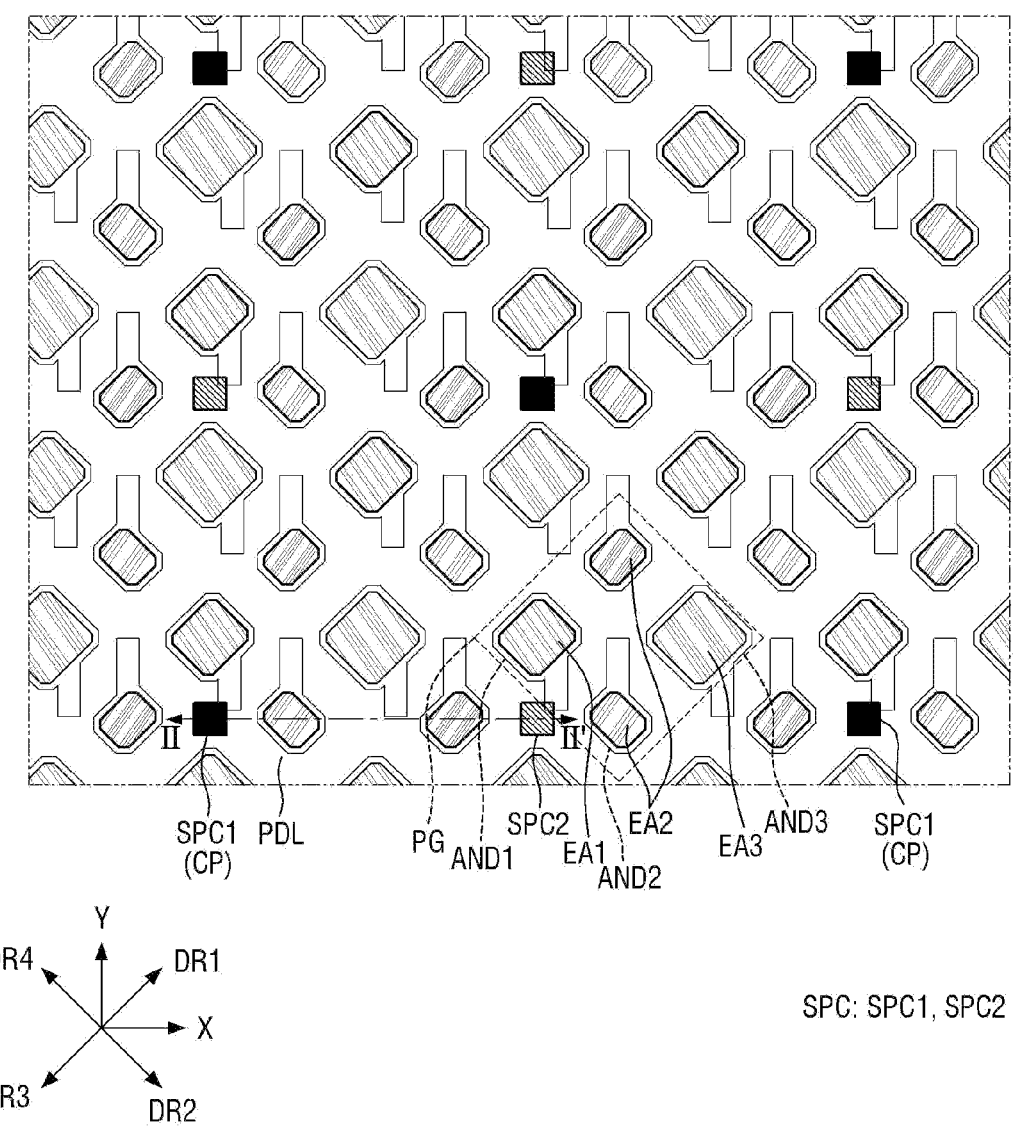
FIG. 12 is a plan view showing a display area of a display device according to still another embodiment.
Figure 13:
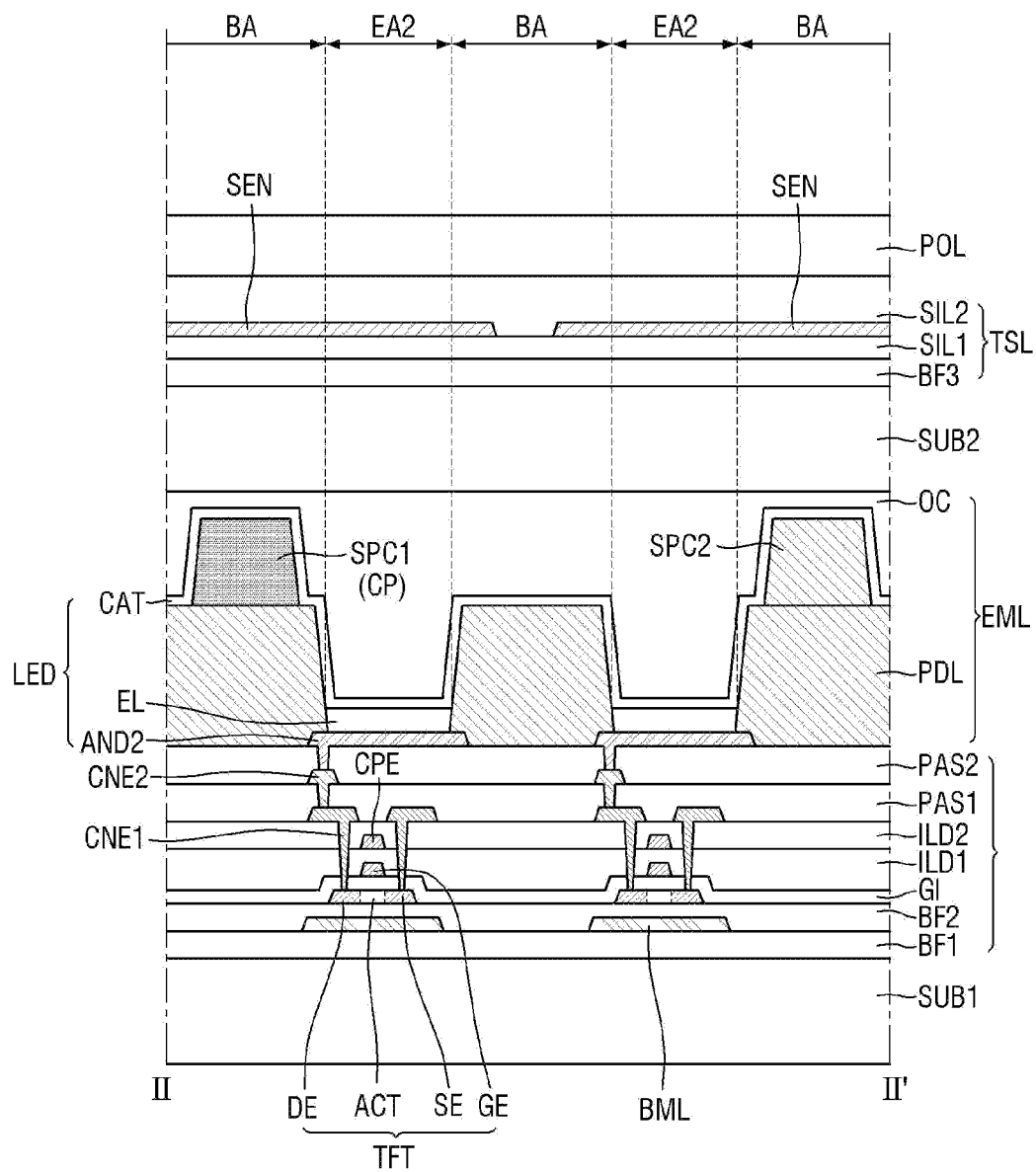
FIG. 13 is a cross-sectional view taken along line II-II' of FIG. 12.

FIG. 12 is a plan view showing a display area of a display device according to still another embodiment, and FIG. 13 is a cross-sectional view taken along line II-II' of FIG. 12. The display device of FIGS. 12 and 13 is different from the display device of FIGS. 5 and 6 in the configuration of the spacer SPC. A description of the same configuration as the above-described configuration will be briefly given or omitted.

Referring to FIGS. 12 and 13, the display panel 100 may include a display unit DU, a touch sensing unit TSU, and a polarizing film POL. The display unit DU may include the first substrate SUB1, the thin film transistor layer TFTL, and the light emitting element layer EML.

The light emitting element layer EML may be disposed on the thin film transistor layer TFTL. The light emitting element layer EML may include the light emitting element LED, a pixel defining layer PDL, a spacer SPC, and a planarization layer OC.

The pixel defining layer PDL may define the first to third emission areas EA1, EA2, and EA3. The pixel defining layer PDL may separate and insulate the first to third pixel electrodes AND1, AND2, and ANDS. The pixel defining layer PDL may transmit light. The pixel defining layer PDL may be transparent, but is not limited thereto.

The spacer SPC may be disposed on the pixel defining layer PDL. The plurality of spacers SPC may be disposed to be spaced apart from each other by a predetermined distance in a light blocking area BA. The spacer SPC may have a polygonal shape or a circular shape in a plan view, but is not limited thereto. The spacer SPC may support the second substrate SUB2. The spacer SPC may maintain a distance between the light emitting element LED and the second substrate SUB2. The spacer SPC may mitigate an impact transmitted to the plurality of pixels and supplement durability of the plurality of pixels. For example, the spacer SPC may include a material having excellent shock absorbency and flexibility to improve the durability of the display device 10.

The spacer SPC may include first and second spacers SPC1 and SPC2. For example, the spacers SPC may be arranged in a regular pattern in a plan view, and the first spacers SPC1 may be arranged in an irregular pattern in a plan view to form the code pattern CP.

The first spacer SPC1 may absorb light of a specific wavelength. The first spacer SPC1 may include an infrared absorbing material or an ultraviolet absorbing material. The first spacer SPC1 may include at least one of a diimmonium compound, a polymethine compound, an anthraquinone compound, or a phthalocyanine compound, but is not limited thereto. Accordingly, when the camera captures an image of the first spacer SPC1 using infrared or ultraviolet light, the first spacer SPC1 that absorbs infrared or ultraviolet light may be distinguished from the first to third pixel electrodes AND1, AND2, and AND3, the touch electrode SEN, the pixel defining layer PDL, and the second spacer SPC2.

For example, the transmittance of the first spacer SPC1 with respect to light of a specific wavelength may be 15% or less. Here, the light of a specific wavelength may have a wavelength of 800 nm to 900 nm, but is not limited thereto. The input device such as an input pen may photograph the first spacer SPC1 using infrared light having a wavelength of 800 nm to 900 nm. When the transmittance of the first spacer SPC1 with respect to light of a specific wavelength is 15% or less, the first spacer SPC1 may be clearly distinguished from the first to third pixel electrodes AND1, AND2, and AND3 that reflect the light of a specific wavelength. When the transmittance of the first spacer SPC1 with respect to light of a specific wavelength exceeds 15%, the first spacer SPC1 may not be clearly distinguished from the first to third pixel electrodes AND1, AND2 and AND3 that reflect the light of a specific wavelength, and the discrimination power of the input device may be reduced. Accordingly, the display device 10 may include a spacer SPC1 having a transmittance of 15% or less with respect to light having a wavelength of 800 nm to 900 nm, so that the input device such as an input pen may easily identify the code pattern CP formed of the planar shape of the first spacer SPC1, and the sensing system may improve sensing sensitivity of the input device.

A plurality of code patterns CP may be disposed over the entire display area DA, and each of the plurality of code patterns CP may have position information according to a specific criterion. The code pattern CP may be photographed by a camera approaching the front of the display device 10, and may be identified through a captured picture or image. At least one code pattern CP or a combination of the code patterns CP may correspond to a preset data code value. For example, the code pattern CP disposed at a specific position may correspond to a data code designated at the corresponding position.

The display device 10 may include the first spacer SPC1 distinguished from the first to third pixel electrodes AND1, AND2, and ANDS, the pixel defining layer PDL, and the second spacer SPC2, and the plurality of code patterns CP determined by the planar shape of the first spacer SPC1, thereby receiving an input from the input device such as an input pen. At least one code pattern CP or a combination of the code patterns CP may have position information according to a specific criterion, and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP formed of the first spacer SPC1 that maintains a distance between the light emitting element LED and the second substrate SUB2, so that it may not be limited in size and may be applied to all electronic devices having a touch function.

The second spacer SPC2 may be formed of the same material as the pixel defining layer PDL, but is not limited thereto. The second spacer SPC2 may transmit light. The second spacer SPC2 may be transparent, but is not limited thereto.

The planarization layer OC may be disposed on the common electrode CAT to cover the plurality of light emitting elements LED. The planarization layer OC may planarize the top end of the light emitting element layer EML. For example, the planarization layer OC may include an organic material to protect the light emitting element layer EML from foreign substances such as dust.

Figure 14:
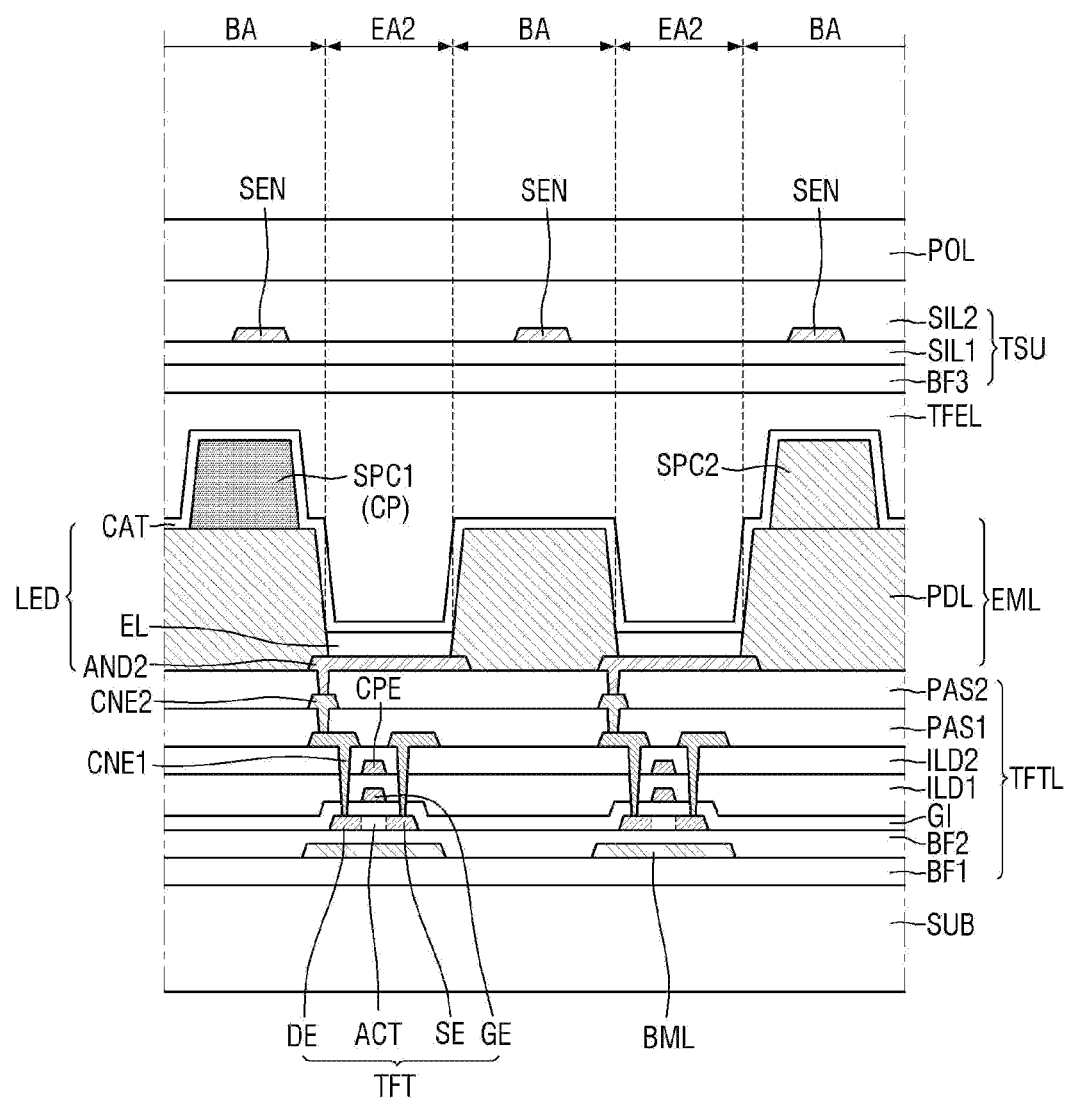
FIG. 14 is a cross-sectional view showing a display device according to still another embodiment.

FIG. 14 is a cross-sectional view showing a display device according to still another embodiment. The display device of FIG. 14 is different from the display device of FIG. 13 in the configuration of the light emitting element layer EML and the touch sensing unit TSU. A description of the same configuration as the above-described configuration will be briefly given or omitted.

Referring to FIG. 14, the display panel 100 may include a display unit DU, a touch sensing unit TSU, and a polarizing film POL. The display unit DU may include the substrate SUB, the thin film transistor layer TFTL, the light emitting element layer EML, and the encapsulation layer TFEL.

The light emitting element layer EML may be disposed on the thin film transistor layer TFTL. The light emitting element layer EML may include the light emitting element LED, the pixel defining layer PDL, and the spacer SPC.

The spacer SPC may be disposed on the pixel defining layer PDL. The plurality of spacers SPC may be disposed to be spaced apart from each other by a predetermined distance in a light blocking area BA. The spacer SPC may maintain a distance between the second pixel electrode AND2 and a metal mask during the formation of the light emitting layer EL. The spacer SPC may mitigate an impact transmitted to the plurality of pixels and supplement durability of the plurality of pixels. For example, the spacer SPC may include a material having excellent shock absorbency and flexibility to improve the durability of the display device 10.

The spacer SPC may include first and second spacers SPC1 and SPC2.

The first spacer SPC1 may absorb light of a specific wavelength. The first spacer SPC1 may include an infrared absorbing material or an ultraviolet absorbing material. The first spacer SPC1 may include at least one of a diimmonium compound, a polymethine compound, an anthraquinone compound, or a phthalocyanine compound, but is not limited thereto. Accordingly, when the camera captures an image of the first spacer SPC1 using infrared or ultraviolet light, the first spacer SPC1 that absorbs infrared or ultraviolet light may be distinguished from the first to third pixel electrodes AND1, AND2, and AND3, the touch electrode SEN, the pixel defining layer PDL, and the second spacer SPC2.

The second spacer SPC2 may be formed of the same material as the pixel defining layer PDL, but is not limited thereto. The second spacer SPC2 may transmit light. The second spacer SPC2 may be transparent, but is not limited thereto.

The encapsulation layer TFEL may be disposed on the common electrode CAT to cover the plurality of light emitting elements LED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign matters such as dust.

The touch sensing unit TSU may be disposed on the encapsulation layer TFEL. The touch sensing unit TSU may include a third buffer layer BF3, a first insulating layer SIL1, the touch electrode SEN, and a second insulating layer SIL2.

The third buffer layer BF3 may be disposed on the encapsulation layer TFEL. The third buffer layer BF3 may have an insulating and optical function. The third buffer layer BF3 may include at least one inorganic layer. Optionally, the third buffer layer BF3 may be omitted.

The touch electrode SEN may be disposed on the first insulating layer SIL1. The touch electrode SEN may be a transparent electrode or a reflective electrode. For example, the touch electrode SEN may include a transparent conductive material to transmit light. As another example, the touch electrode SEN may include an infrared reflective material or an ultraviolet reflective material to reflect infrared or ultraviolet light. The touch electrode SEN may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The touch electrode SEN may be formed in a mesh structure or a net structure in a plan view. The touch electrode SEN may surround each of the first to third emission areas EA1, EA2, and EA3 of the pixel group PG in a plan view. Thus, the touch electrode SEN may not overlap the first to third emission areas EA1, EA2, and EA3, but may overlap the light blocking area BA. Accordingly, the display device 10 may prevent the luminance of light emitted from the first to third emission areas EA1, EA2, and EA3 from being reduced by the touch sensing unit TSU.

Figure 15:
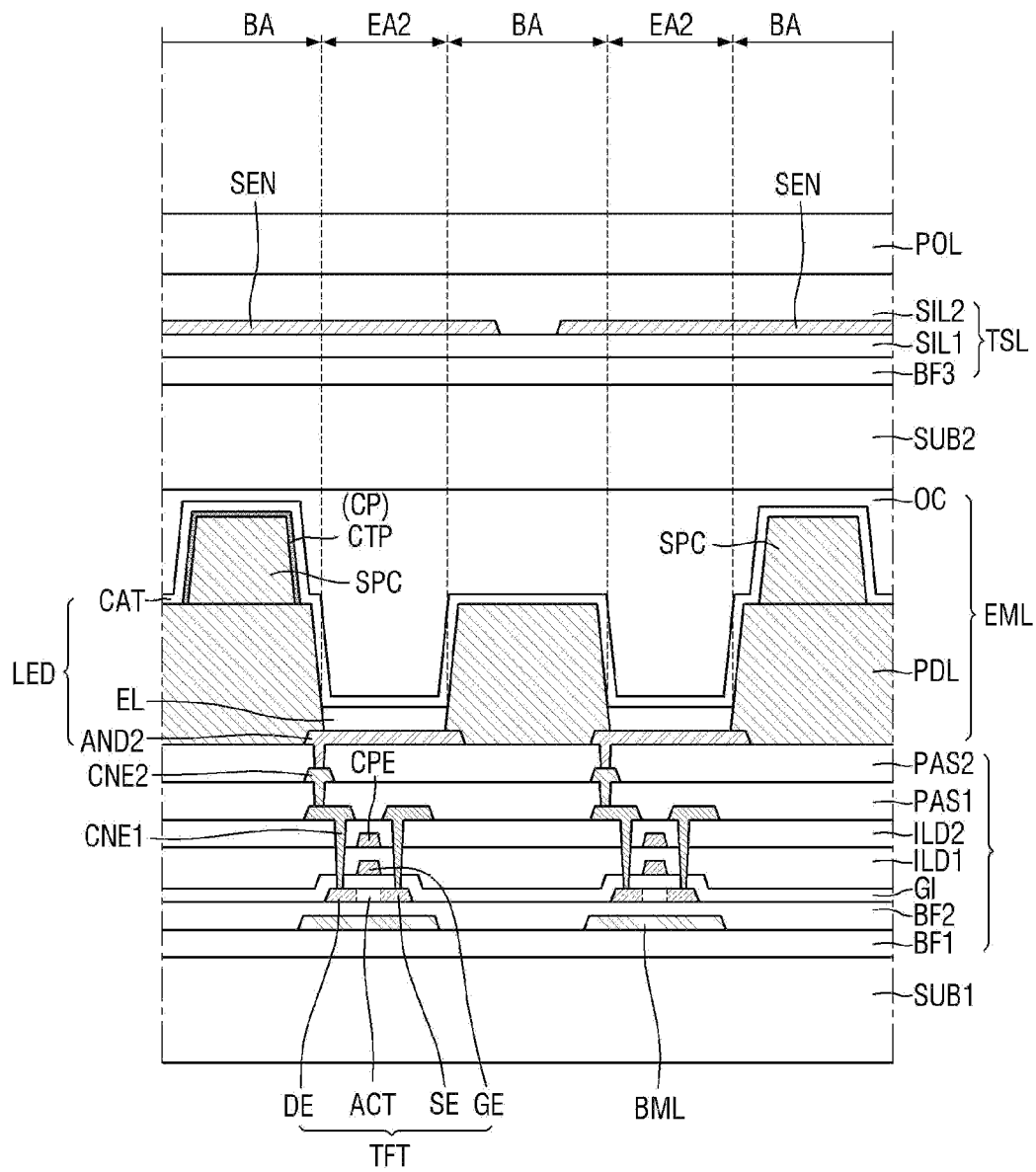
FIG. 15 is a cross-sectional view showing a display device according to still another embodiment.

FIG. 15 is a cross-sectional view showing a display device according to still another embodiment. The display device of FIG. 15 is different from the display device of FIG. 13 in the configuration of a coating pattern CTP. A description of the same configuration as the above-described configuration will be briefly given or omitted.

Referring to FIG. 15, the display panel 100 may include a display unit DU, a touch sensing unit TSU, and a polarizing film POL. The display unit DU may include a first substrate SUB1, the thin film transistor layer TFTL, and the light emitting element layer EML.

The light emitting element layer EML may be disposed on the thin film transistor layer TFTL. The light emitting element layer EML may include the light emitting element LED, the pixel defining layer PDL, the spacer SPC, the coating pattern CTP, and the planarization layer OC.

The pixel defining layer PDL may define the first to third emission areas EA1, EA2, and EA3. The pixel defining layer PDL may separate and insulate the first to third pixel electrodes AND1, AND2, and AND3. The pixel defining layer PDL may transmit light. The pixel defining layer PDL may be transparent, but is not limited thereto.

The spacer SPC may be disposed on the pixel defining layer PDL. The plurality of spacers SPC may be disposed to be spaced apart from each other by a predetermined distance in a light blocking area BA. The spacer SPC may have a polygonal shape or a circular shape in a plan view, but is not limited thereto. The spacer SPC may support the second substrate SUB2. The spacer SPC may maintain a distance between the light emitting element LED and the second substrate SUB2. The spacer SPC may mitigate an impact transmitted to the plurality of pixels and supplement durability of the plurality of pixels. For example, the spacer SPC may include a material having excellent shock absorbency and flexibility to improve the durability of the display device 10. The spacer SPC may transmit light. The spacer SPC may be transparent, but is not limited thereto. The spacer SPC may be formed of the same material as the pixel defining layer PDL, but is not limited thereto.

The coating pattern CTP may be disposed on at least some of the plurality of spacers SPC. For example, the spacers SPC may be arranged in a regular pattern in a plan view, and the coating pattern CTP may be arranged in an irregular pattern in a plan view to form the code pattern CP. The coating pattern CTP may cover the top surface and the side surface of the spacer SPC. The coating pattern CTP may absorb light of a specific wavelength. The coating pattern CTP may include an infrared absorbing material or an ultraviolet absorbing material. The coating pattern CTP may include at least one of a diimmonium compound, a polymethine compound, an anthraquinone compound, or a phthalocyanine compound, but is not limited thereto. Accordingly, when the camera captures an image of the coating pattern CTP using infrared or ultraviolet light, the coating pattern CTP that absorbs infrared or ultraviolet light may be distinguished from the first to third pixel electrodes AND1, AND2, and AND3, the touch electrode SEN, and the pixel defining layer PDL.

For example, the transmittance of the coating pattern CTP with respect to light of a specific wavelength may be 15% or less. Here, the light of a specific wavelength may have a wavelength of 800 nm to 900 nm, but is not limited thereto. The input device such as an input pen may photograph the coating pattern CTP using infrared light having a wavelength of 800 nm to 900 nm. When the transmittance of the coating pattern CTP with respect to light of a specific wavelength is 15% or less, the coating pattern CTP may be clearly distinguished from the first to third pixel electrodes AND1, AND2, and AND3 that reflect the light of a specific wavelength. When the transmittance of the coating pattern CTP with respect to light of a specific wavelength exceeds 15%, the coating pattern CTP may not be clearly distinguished from the first to third pixel electrodes AND1, AND2, and AND3 that reflect the light of a specific wavelength, and the discrimination power of the input device may be reduced. Accordingly, the display device 10 may include the coating pattern CTP having a transmittance of 15% or less with respect to light having a wavelength of 800 nm to 900 nm, so that the input device such as an input pen may easily identify the code pattern CP formed of the planar shape of the coating pattern CTP, and the sensing system may improve sensing sensitivity of the input device.

A plurality of code patterns CP may be disposed over the entire display area DA, and each of the plurality of code patterns CP may have position information according to a specific criterion. The code pattern CP may be photographed by a camera approaching the front of the display device 10, and may be identified through a captured picture or image. At least one code pattern CP or a combination of the code patterns CP may correspond to a preset data code value. For example, the code pattern CP disposed at a specific position may correspond to a data code designated at the corresponding position.

The display device 10 may include the coating pattern CTP distinguished from the first to third pixel electrodes AND1, AND2, and AND3 and the pixel defining layer PDL, and the plurality of code patterns CP determined by the planar shape of the coating pattern CTP, thereby receiving an input from the input device such as an input pen. At least one code pattern CP or a combination of the code patterns CP may have position information according to a specific criterion, and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP formed of the coating pattern CTP disposed on the spacer SPC, so that it may not be limited in size and may be applied to all electronic devices having a touch function.

The planarization layer OC may be disposed on the common electrode CAT to cover the plurality of light emitting elements LED. The planarization layer OC may planarize the top end of the light emitting element layer EML. For example, the planarization layer OC may include an organic material to protect the light emitting element layer EML from foreign substances such as dust.

Figure 16:
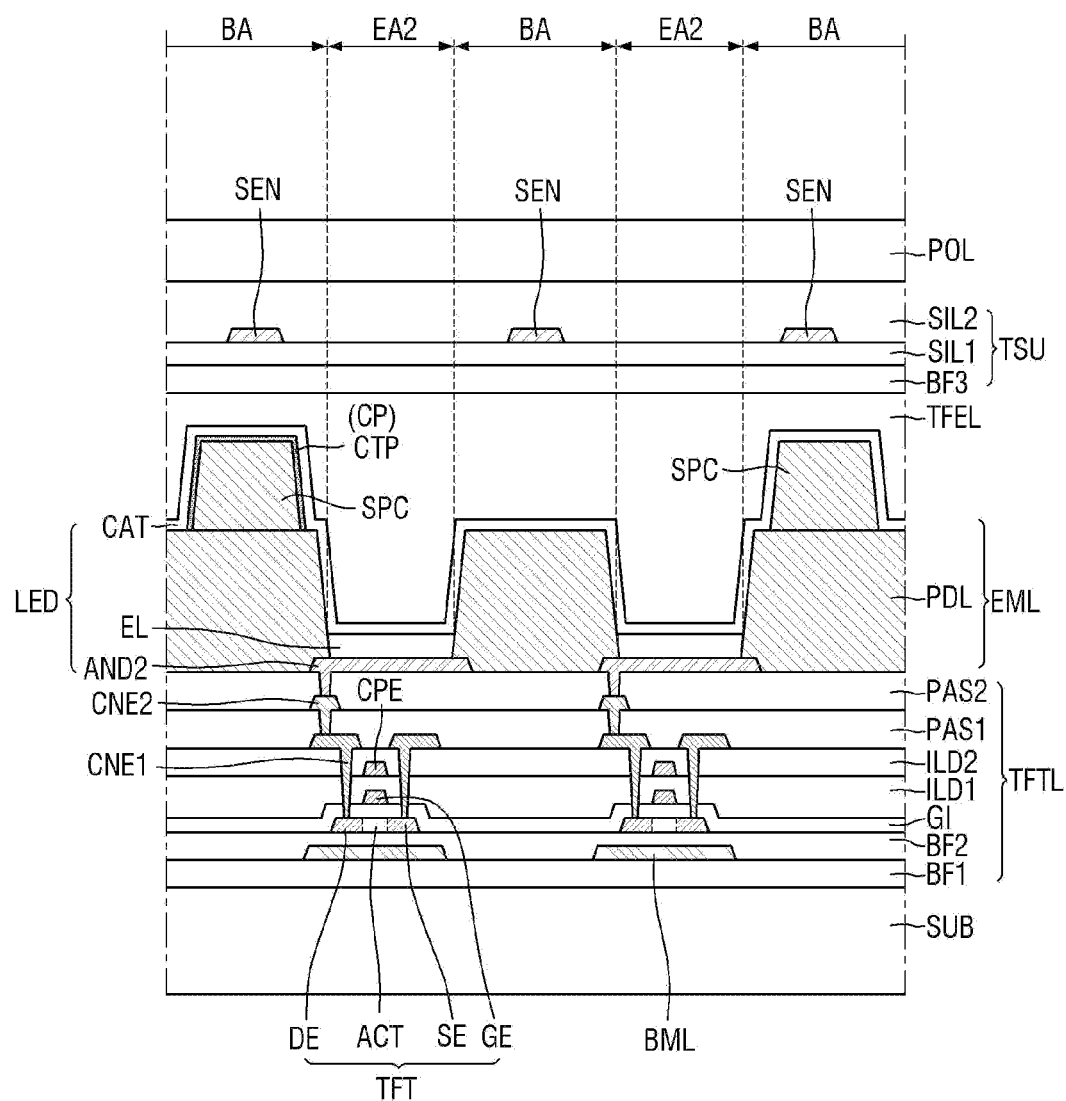
FIG. 16 is a cross-sectional view showing a display device according to still another embodiment.

FIG. 16 is a cross-sectional view showing a display device according to still another embodiment. The display device of FIG. 16 is different from the display device of FIG. 15 in the configuration of the light emitting element layer EML and the touch sensing unit TSU. A description of the same configuration as the above-described configuration will be briefly given or omitted.

Referring to FIG. 16, the display panel 100 may include a display unit DU, a touch sensing unit TSU, and a polarizing film POL. The display unit DU may include the substrate SUB, the thin film transistor layer TFTL, the light emitting element layer EML, and the encapsulation layer TFEL.

The light emitting element layer EML may be disposed on the thin film transistor layer TFTL. The light emitting element layer EML may include the light emitting element LED, the pixel defining layer PDL, the spacer SPC, and the coating pattern CTP.

The spacer SPC may be disposed on the pixel defining layer PDL. The plurality of spacers SPC may be disposed to be spaced apart from each other by a predetermined distance in a light blocking area BA. The spacer SPC may maintain a distance between the second pixel electrode AND2 and a metal mask during the formation of the light emitting layer EL. The spacer SPC may mitigate an impact transmitted to the plurality of pixels and supplement durability of the plurality of pixels. For example, the spacer SPC may include a material having excellent shock absorbency and flexibility to improve the durability of the display device 10. The spacer SPC may transmit light. The spacer SPC may be transparent, but is not limited thereto. The spacer SPC may be formed of the same material as the pixel defining layer PDL, but is not limited thereto.

The coating pattern CTP may be disposed on at least some of the plurality of spacers SPC. The coating pattern CTP may cover the top surface and the side surface of the spacer SPC. The coating pattern CTP may absorb light of a specific wavelength. The coating pattern CTP may include an infrared absorbing material or an ultraviolet absorbing material. The coating pattern CTP may include at least one of a diimmonium compound, a polymethine compound, an anthraquinone compound, or a phthalocyanine compound, but is not limited thereto. Accordingly, when the camera captures an image of the coating pattern CTP using infrared or ultraviolet light, the coating pattern CTP that absorbs infrared or ultraviolet light may be distinguished from the first to third pixel electrodes AND1, AND2, and AND3, the touch electrode SEN, and the pixel defining layer PDL.

The encapsulation layer TFEL may be disposed on the common electrode CAT to cover the plurality of light emitting elements LED. The encapsulation layer TFEL may include at least one inorganic layer to prevent oxygen or moisture from penetrating into the light emitting element layer EML. The encapsulation layer TFEL may include at least one organic layer to protect the light emitting element layer EML from foreign matters such as dust.

The touch sensing unit TSU may be disposed on the encapsulation layer TFEL. The touch sensing unit TSU may include a third buffer layer BF3, a first insulating layer SIL1, the touch electrode SEN, and a second insulating layer SIL2.

The third buffer layer BF3 may be disposed on the encapsulation layer TFEL. The third buffer layer BF3 may have an insulating and optical function. The third buffer layer BF3 may include at least one inorganic layer. Optionally, the third buffer layer BF3 may be omitted.

The touch electrode SEN may be disposed on the first insulating layer SIL1. The touch electrode SEN may be a transparent electrode or a reflective electrode. For example, the touch electrode SEN may include a transparent conductive material to transmit light. As another example, the touch electrode SEN may include an infrared reflective material or an ultraviolet reflective material to reflect infrared or ultraviolet light. The touch electrode SEN may be formed of a single layer containing molybdenum (Mo), titanium (Ti), copper (Cu), aluminum (Al), or indium tin oxide (ITO), or may be formed to have a stacked structure (Ti/Al/Ti) of aluminum and titanium, a stacked structure (ITO/Al/ITO) of aluminum and ITO, an Ag—Pd—Cu (APC) alloy, or a stacked structure (ITO/APC/ITO) of APC alloy and ITO.

The touch electrode SEN may be formed in a mesh structure or a net structure in a plan view. The touch electrode SEN may surround each of the first to third emission areas EA1, EA2, and EA3 of the pixel group PG in a plan view. Thus, the touch electrode SEN may not overlap the first to third emission areas EA1, EA2, and EA3. Accordingly, the display device 10 may prevent the luminance of light emitted from the first to third emission areas EA1, EA2, and EA3 from being reduced by the touch sensing unit TSU.

Figure 17:
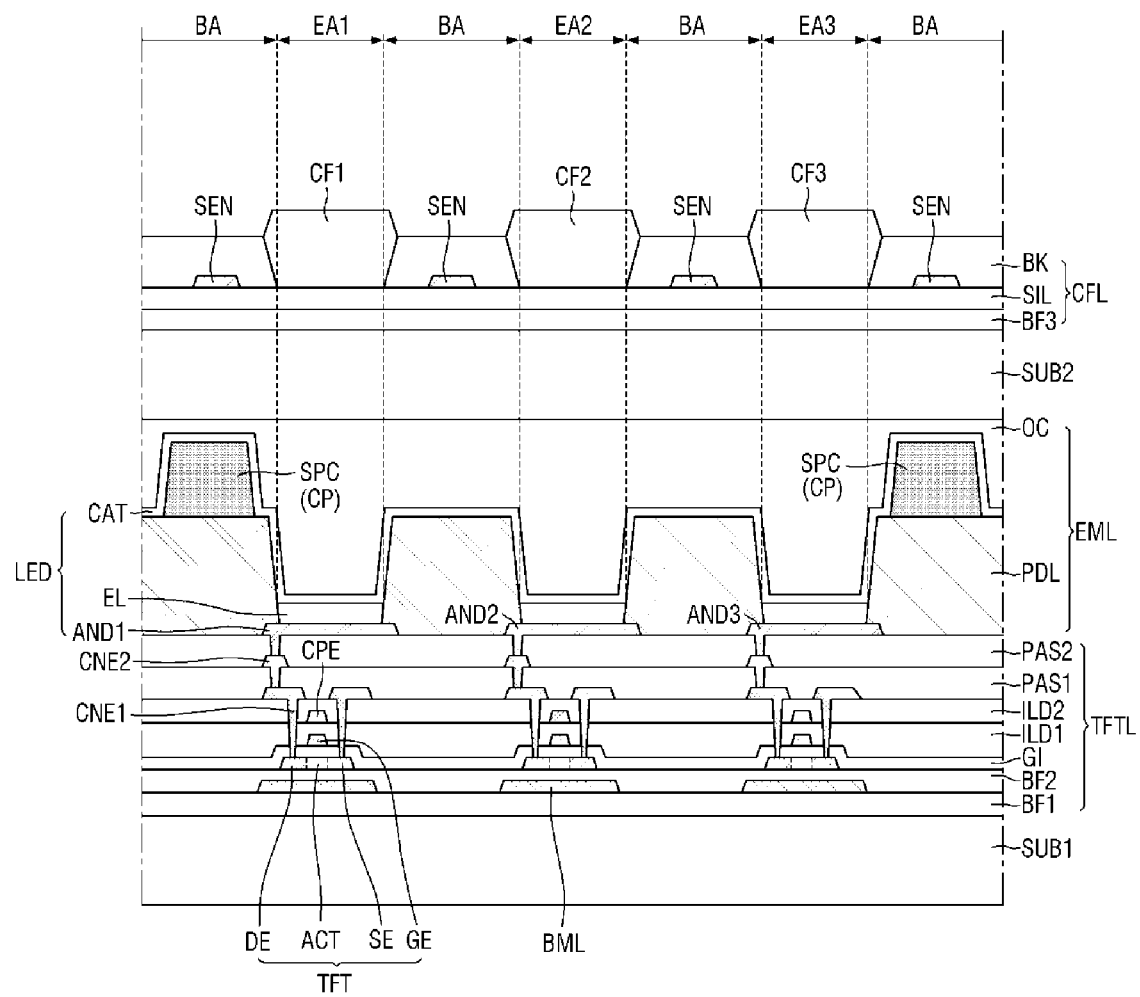
FIG. 17 is a cross-sectional view showing a display device according to still another embodiment.

FIG. 17 is a cross-sectional view showing a display device according to still another embodiment. The display device of FIG. 17 is different from the display device of FIG. 6 in the configuration above the second substrate SUB2. A description of the same configuration as the above-described configuration will be briefly given or omitted.

Referring to FIG. 17, the display panel 100 may include the first substrate SUB1, the thin film transistor layer TFTL, the light emitting element layer EML, the second substrate SUB2, and a color filter layer CFL.

The first substrate SUB1 may be a base substrate or a base member. For example, the first substrate SUB1 may be a rigid substrate. The first substrate SUB1 may include a glass material or a metal material, but is not limited thereto. For another example, the first substrate SUB1 may include an insulating material such as a polymer resin such as polyimide (PI).

The thin film transistor layer TFTL may be disposed on the first substrate SUB1. The thin film transistor layer TFTL may include a first buffer layer BF1, a light blocking layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The light emitting element layer EML may be disposed on the thin film transistor layer TFTL. The light emitting element layer EML may include the light emitting element LED, a pixel defining layer PDL, a spacer SPC, and a planarization layer OC.

The pixel defining layer PDL may define the first to third emission areas EA1, EA2, and EA3. The pixel defining layer PDL may separate and insulate the first to third pixel electrodes AND1, AND2, and ANDS. The pixel defining layer PDL may transmit light. The pixel defining layer PDL may be transparent, but is not limited thereto.

The spacer SPC may be disposed on the pixel defining layer PDL. That is, the spacer SPC may protrude from the pixel defining layer PDL. The plurality of spacers SPC may be disposed to be spaced apart from each other by a predetermined distance in a light blocking area BA. The spacer SPC may have a rectangular shape in a plan view, but is not limited thereto and may have other polygonal shapes. The spacer SPC may support the second substrate SUB2. The spacer SPC may maintain a distance between the light emitting element LED and the second substrate SUB2. The spacer SPC may mitigate an impact transmitted to the plurality of pixels and supplement durability of the plurality of pixels. For example, the spacer SPC may include a material having excellent shock absorbency and flexibility to improve the durability of the display device 10.

The spacer SPC may absorb light of a specific wavelength. The spacer SPC may include an infrared absorbing material or an ultraviolet absorbing material. For example, the spacer SPC may include at least one of a diimmonium compound, a polymethine compound, an anthraquinone compound, or a phthalocyanine compound, but is not limited thereto. Accordingly, when the camera captures the spacer SPC using infrared or ultraviolet light, the spacer SPC that absorbs infrared or ultraviolet light may be distinguished from the first to third pixel electrodes AND1, AND2, AND3, the touch electrode SEN, and the pixel defining layer PDL.

The code pattern CP may be formed of the planar shape of the spacer SPC. A plurality of code patterns CP may be disposed over the entire display area DA, and each of the plurality of code patterns CP may have position information according to a specific criterion. The code pattern CP may be photographed by a camera approaching the front of the display device 10, and may be identified through a captured picture or image. At least one code pattern CP or a combination of the code patterns CP may correspond to a preset data code value. For example, the code pattern CP disposed at a specific position may correspond to a data code designated at the corresponding position.

The planarization layer OC may be disposed on the common electrode CAT to cover the plurality of light emitting elements LED. The planarization layer OC may planarize the top end of the light emitting element layer EML. For example, the planarization layer OC may include an organic material to protect the light emitting element layer EML from foreign substances such as dust.

The second substrate SUB2 may be disposed on the light emitting element layer EML. The second substrate SUB2 may be a base substrate or a base member, and may support the color filter layer CFL. The second substrate SUB2 may be a base member that encapsulates the display unit DU. For example, the second substrate SUB2 may be a rigid substrate. The second substrate SUB2 may include a glass material or a metal material, but is not limited thereto. For another example, the second substrate SUB2 may include an insulating material such as a polymer resin such as polyimide (PI).

The color filter layer CFL may be disposed on the second substrate SUB2. The color filter layer CFL may include a third buffer layer BF3, an insulating layer SIL, a plurality of color filters CF, a light blocking part BK, and a plurality of touch electrodes SEN.

The third buffer layer BF3 may be disposed on the second substrate SUB2. The third buffer layer BF3 may have an insulating and optical function. The third buffer layer BF3 may include at least one inorganic layer. Optionally, the third buffer layer BF3 may be omitted.

The insulating layer SIL may be disposed on the third buffer layer BF3. The first insulating layer SIL1 may have an insulating and optical function.

The plurality of color filters CF may include first to third color filters CF1, CF2, and CF3. The first to third color filters CF1, CF2, and CF3 may be disposed on the insulating layer SIL to correspond to the first to third emission areas EA1, EA2, and EA3, respectively.

The first color filter CF1 may be disposed in the first emission area EA1 on the insulating layer SIL. The first color filter CF1 may be surrounded by the light blocking part BK in a plan view. The first color filter CF1 may selectively allow the first color light (e.g., red light) to pass therethrough, and block or absorb the second color light (e.g., green light) and the third color light (e.g., blue light). For example, the first color filter CF1 may be a red color filter and contain a red colorant.

The second color filter CF2 may be disposed in the second emission area EA2 on the insulating layer SIL. The second color filter CF2 may be surrounded by the light blocking part BK in a plan view. The second color filter CF2 may selectively allow the second color light (e.g., green light) to pass therethrough, and block or absorb the first color light (e.g., red light) and the third color light (e.g., blue light). For example, the second color filter CF2 may be a green color filter and contain a green colorant.

The third color filter CF3 may be disposed in the third emission area EA3 on the insulating layer SIL. The third color filter CF3 may be surrounded by the light blocking part BK in a plan view. The third color filter CF3 may selectively allow the third color light (e.g., blue light) to pass therethrough, and block or absorb the first color light (e.g., red light) and the second color light (e.g., green light). For example, the third color filter CF3 may be a blue color filter and contain a blue colorant.

The first to third color filters CF1, CF2, and CF3 may absorb a part of the light coming from the outside of the display device 10 to reduce the reflected light of the external light. Thus, the first to third color filters CF1, CF2, and CF3 can prevent color distortion caused by the reflection of the external light.

The light blocking part BK may be disposed in the light blocking area BA on the insulating layer SIL. The light blocking part BK may overlap the pixel defining layer PDL in the thickness direction. The light blocking part BK may absorb visible light and transmit infrared and ultraviolet light. The light blocking part BK may prevent visible light infiltration and color mixture between the first to third emission areas EA1, EA2, and EA3, which leads to the improvement of color reproducibility of the display device 10. Infrared or ultraviolet light passing through the light blocking part BK may be absorbed by the spacer SPC.

For example, the light blocking part BK may include an inorganic black pigment or an organic black pigment. The inorganic black pigment may be carbon black, and the organic black pigment may include at least one of lactam black, perylene black, or aniline black, but they are not limited thereto.

The plurality of touch electrodes SEN may be disposed in the light blocking area BA on the insulating layer SIL and may be covered with the light blocking part BK. The plurality of touch electrodes SEN may not overlap the first to third emission areas EA1, EA2, and EA3. The plurality of touch electrodes SEN may be disposed in the color filter layer CFL without requiring a separate touch sensor layer. The plurality of touch electrodes SEN may transmit light of a specific wavelength. The touch electrode SEN may be a transparent electrode including a transparent conductive material. When the camera captures an image of the spacer SPC using infrared or ultraviolet light, the spacer SPC may be distinguished from the first to third pixel electrodes AND1, AND2, and AND3, the touch electrode SEN, and the pixel defining layer PDL.

The display device 10 may include the spacer SPC distinguished from the first to third pixel electrodes AND1, AND2, and AND3 and the pixel defining layer PDL, and the plurality of code patterns CP determined by the planar shape of the spacer SPC, thereby receiving an input from the input device such as an input pen. At least one code pattern CP or a combination of the code patterns CP may have position information according to a specific criterion, and may correspond to a preset data code one-to-one. Accordingly, the display device 10 may receive coordinate data generated without complex calculation and correction by using the data code, thereby performing the corresponding function according to the correct input coordinates, reducing cost and power consumption, and simplifying a driving process. In addition, the display device 10 may include the code pattern CP formed of the spacer SPC that maintains a distance between the light emitting element LED and the second substrate SUB2, so that it may not be limited in size and may be applied to all electronic devices having a touch function.

Figure 18:
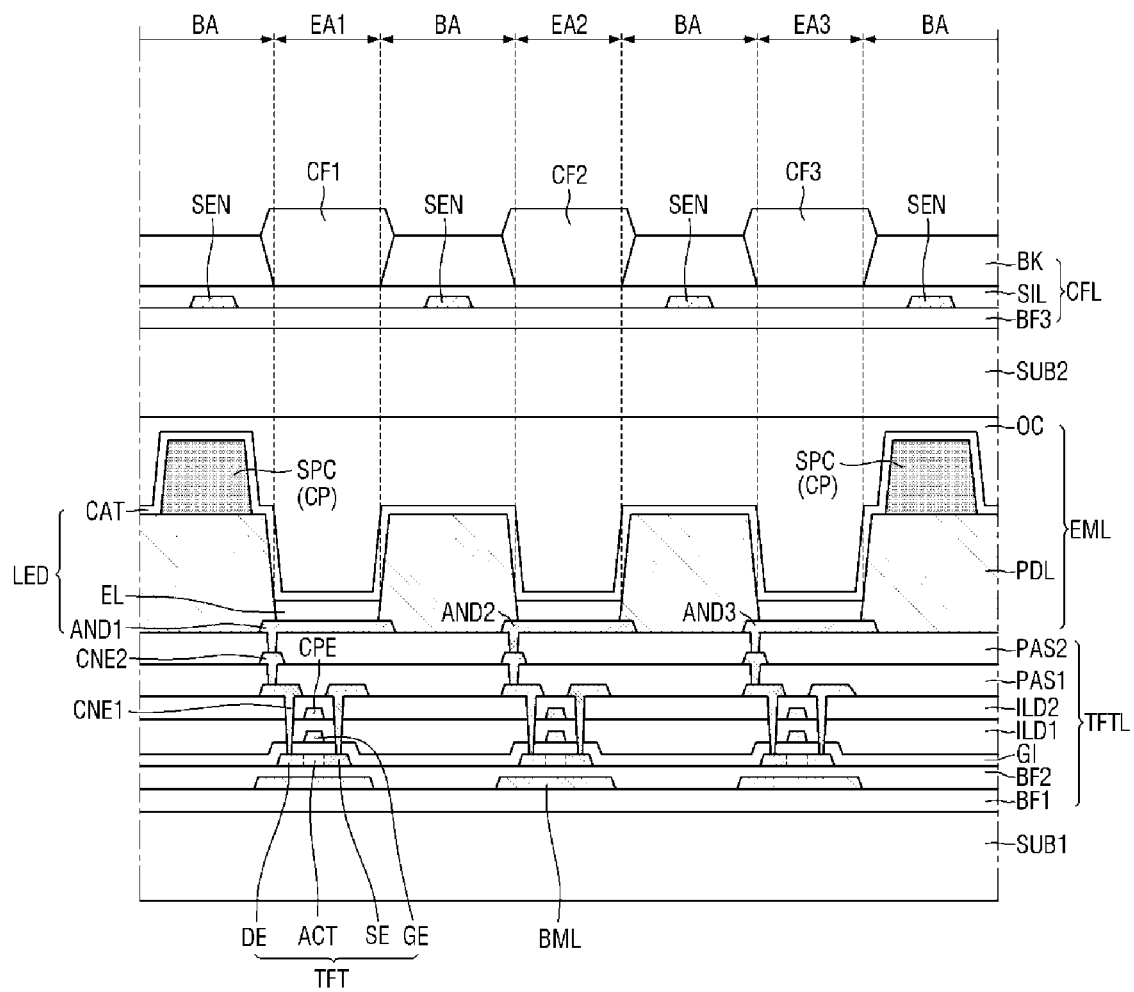
FIG. 18 is a cross-sectional view showing a display device according to still another embodiment.

FIG. 18 is a cross-sectional view showing a display device according to still another embodiment. The display device of FIG. 18 is different from the display device of FIG. 17 in the configuration of the plurality of touch electrodes SEN. A description of the same configuration as the above-described configuration will be briefly given or omitted.

Referring to FIG. 18, the display panel 100 may include the first substrate SUB1, the thin film transistor layer TFTL, the light emitting element layer EML, the second substrate SUB2, and a color filter layer CFL.

The color filter layer CFL may be disposed on the second substrate SUB2. The color filter layer CFL may include the third buffer layer BF3, the insulating layer SIL, the plurality of color filters CF, the light blocking part BK, and the plurality of touch electrodes SEN.

The plurality of touch electrodes SEN may be disposed on the third buffer layer BF3. The plurality of touch electrodes SEN may not overlap the first to third emission areas EA1, EA2, and EA3. The plurality of touch electrodes SEN may transmit light of a specific wavelength. The touch electrode SEN may be a transparent electrode including a transparent conductive material. When the camera captures an image of the spacer SPC using infrared or ultraviolet light, the spacer SPC may be distinguished from the first to third pixel electrodes AND1, AND2, and AND3, the touch electrode SEN, and the pixel defining layer PDL.

The insulating layer SIL may be disposed on the plurality of touch electrodes SEN and the third buffer layer BF3. The insulating layer SIL may have an insulating and optical function.

The plurality of color filters CF may include first to third color filters CF1, CF2, and CF3. The first to third color filters CF1, CF2, and CF3 may be disposed on the insulating layer SIL to correspond to the first to third emission areas EA1, EA2, and EA3, respectively. The first to third color filters CF1, CF2, and CF3 may absorb a part of the light coming from the outside of the display device 10 to reduce the reflected light of the external light. Thus, the first to third color filters CF1, CF2, and CF3 can prevent color distortion caused by the reflection of the external light.

The light blocking part BK may be disposed in the light blocking area BA on the insulating layer SIL. The light blocking part BK may overlap the pixel defining layer PDL in the thickness direction. The light blocking part BK may absorb visible light and transmit infrared and ultraviolet light. The light blocking part BK may prevent visible light infiltration and color mixture between the first to third emission areas EA1, EA2, and EA3, which leads to the improvement of color reproducibility of the display device 10. Infrared or ultraviolet light passing through the light blocking part BK may be absorbed by the pixel defining layer DPL.

Figure 19:
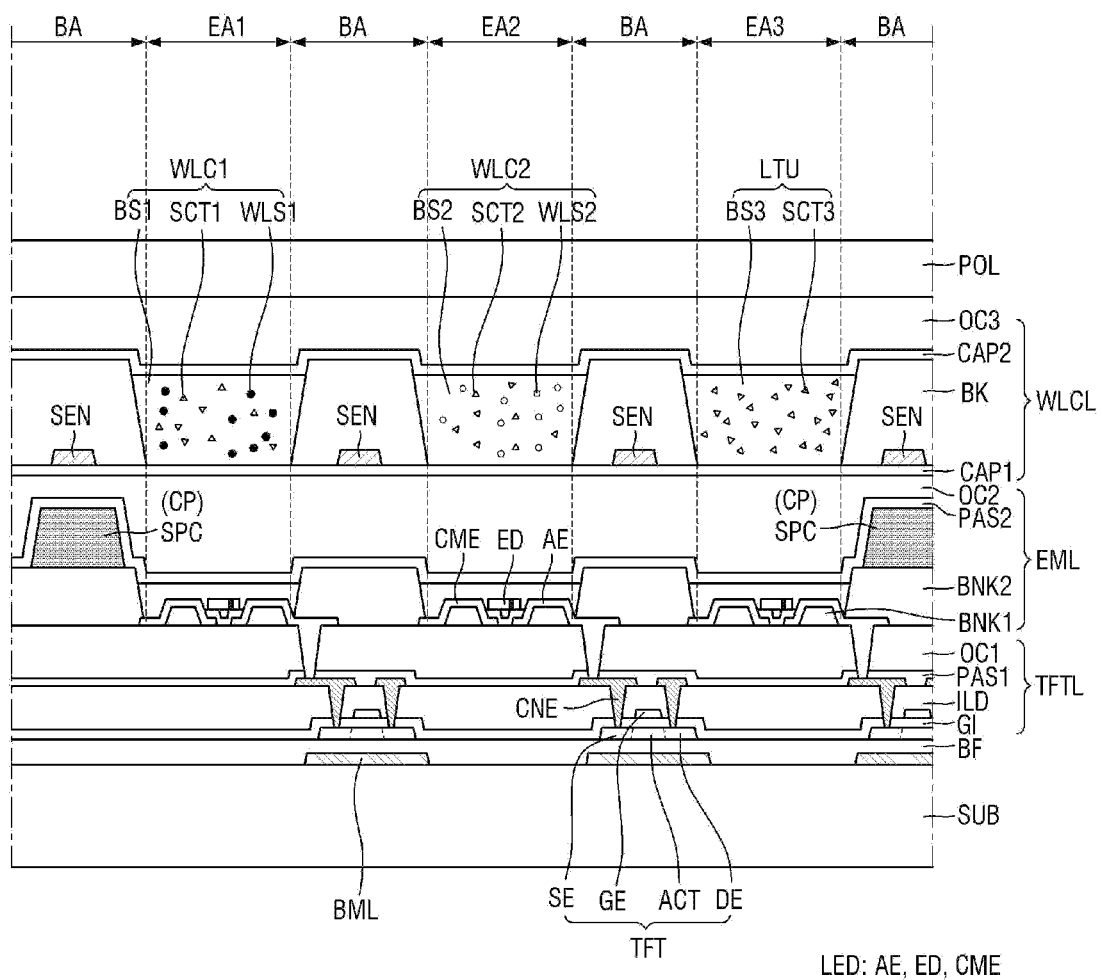
FIG. 19 is a cross-sectional view showing a display device according to still another embodiment.

FIG. 19 is a cross-sectional view showing a display device according to still another embodiment. The display device of FIG. 19 is different from the display device of FIG. 18 in that it has a different configuration of the light emitting element layer EML and further includes a wavelength conversion layer WLCL. A description of the same configuration as the above-described configuration will be briefly given or omitted.

Referring to FIG. 19, the display panel 100 may include the substrate SUB, the thin film transistor layer TFTL, the light emitting element layer EML, the wavelength conversion layer WLCL, and the polarizing film POL.

The substrate SUB may be a base substrate or a base member. For example, the substrate SUB may be a rigid substrate. The substrate SUB may include a glass material or a metal material, but is not limited thereto. For another example, the substrate SUB may include an insulating material such as a polymer resin such as polyimide (PI).

The thin film transistor layer TFTL may be disposed on the substrate SUB. The thin film transistor layer TFTL may include a buffer layer BF, the light blocking layer BML, the thin film transistor TFT, the gate insulating layer GI, an interlayer insulating layer ILD, a connection electrode CNE, a first passivation layer PAS1, and a first planarization layer OC1.

The light emitting element layer EML may be disposed on the thin film transistor layer TFTL. The light emitting element layer EML may include the light emitting element LED, a first bank BNK1, a second bank BNK2, the spacer SPC, a second passivation layer PAS2, and a second planarization layer OC2.

The light emitting element LED may be disposed on the thin film transistor layer TFTL. The light emitting element LED may include a first electrode AE, a second electrode CME, and a light emitting diode ED.

The first electrode AE may be disposed on the first planarization layer OC1. For example, the first electrode AE may cover the first bank BNK1 provided on the first planarization layer OC1. The first electrode AE may be disposed to overlap each of the first to third emission areas EA1, EA2, and EA3 defined by the second bank BNK2. The first electrode AE may be connected to the source electrode SE of the thin film transistor TFT through the connection electrode CNE. The first electrode AE may be an anode electrode of the light emitting element LED, but is not limited thereto.

The second electrode CME may be disposed on the first planarization layer OC1 to be spaced apart from the first electrode AE with respect to light emitting diode ED. For example, the second electrode CME may cover the first bank BNK1 disposed on the first planarization layer OC1. The second electrode CME may be disposed to overlap each of the first to third emission areas EA1, EA2, and EA3 defined by the second bank BNK2. For example, the second electrode CME may receive a low potential voltage supplied from a low potential line to all the pixels. The second electrode CME may be a cathode electrode of the light emitting element LED, but is not limited thereto.

The first and second electrodes AE and CME may reflect light of a specific wavelength. The first and second electrodes AE and CME may reflect infrared or ultraviolet light. The first and second electrodes AE and CME may include an infrared reflective material or an ultraviolet reflective material. For example, the first and second electrodes AE and CME may contain at least one of silver (Ag), copper (Cu), aluminum (Al), nickel (Ni), or lanthanum (La). For another example, the first and second electrodes AE and CME may include a material such as indium tin oxide (ITO), indium zinc oxide (IZO), and indium tin zinc oxide (ITZO). For still another example, the first and second electrodes AE and CME may include a transparent conductive material layer and a metal layer having high reflectivity, or may include one layer containing a transparent conductive material or a metal having high reflectivity. The first and second electrodes AE and CME may have a stacked structure of ITO/Ag/ITO, ITO/Ag/IZO, ITO/Ag/ITZO/IZO, or the like.

The light emitting diode ED may be disposed between the first electrode AE and the second electrode CME on the first planarization layer OC1. One end of the light emitting diode ED may be connected to the first electrode AE, and the other end of the light emitting diode ED may be connected to the second electrode CME. The light emitting diode ED may have a micro-meter or nano-meter size, and may be an inorganic light emitting diode including an inorganic material. The light emitting diode ED may be aligned between the first electrode AE and the second electrode CME according to an electric field formed in a specific direction between the first electrode AE and the second electrode CME which face each other.

For example, a plurality of light emitting diodes ED may include active layers having the same material and emit light of the same wavelength band or light of the same color. Light emitted from each of the first to third emission areas EA1, EA2, and EA3 may have the same color. For example, the light emitting diodes ED may emit the third color light or blue light having a peak wavelength in the range of 440 nm to 480 nm. Therefore, the light emitting element layer EML may emit the third color light or blue light.

The second bank BNK2 may be disposed in the light blocking area BA on the first planarization layer OC1. The second bank BNK2 may define the first to third emission areas EA1, EA2 and EA3. For example, the second bank BNK2 may surround each of the first to third emission areas EA1, EA2 and EA3, but is not limited thereto. The second bank BNK2 may separate and insulate the first electrode AE or the second electrode CME of each of the plurality of light emitting elements LED.

The spacer SPC may be disposed on the second bank BNK2. The plurality of spacers SPC may be disposed to be spaced apart from each other by a predetermined distance in a light blocking area BA. The spacer SPC may have a rectangular shape in a plan view, but is not limited thereto and may have other polygonal shapes. The spacer SPC may support the wavelength conversion layer WLCL. The spacer SPC may maintain a distance between the light emitting element LED and the wavelength conversion layer WLCL. The spacer SPC may mitigate an impact transmitted to the plurality of pixels and supplement durability of the plurality of pixels. For example, the spacer SPC may include a material having excellent shock absorbency and flexibility to improve the durability of the display device 10.

The spacer SPC may absorb light of a specific wavelength. The spacer SPC may include an infrared absorbing material or an ultraviolet absorbing material. For example, the spacer SPC may include at least one of a diimmonium compound, a polymethine compound, an anthraquinone compound, or a phthalocyanine compound, but is not limited thereto. Accordingly, when the camera captures an image of the spacer SPC using infrared or ultraviolet light, the spacer SPC that absorbs infrared or ultraviolet light may be distinguished from the first and second electrodes AE and CME, the touch electrode SEN, and the second bank BNK2.

The code pattern CP may be formed of the planar shape of the spacer SPC. A plurality of code patterns CP may be disposed over the entire display area DA, and each of the plurality of code patterns CP may have position information according to a specific criterion. The code pattern CP may be photographed by a camera approaching the front of the display device 10, and may be identified through a captured picture or image. At least one code pattern CP or a combination of the code patterns CP may correspond to a preset data code value. For example, the code pattern CP disposed at a specific position may correspond to a data code designated at the corresponding position.

The second passivation layer PAS2 may be disposed on the plurality of light emitting elements LED and the second bank BNK2. The second passivation layer PAS2 may cover the plurality of light emitting elements LED and may protect the plurality of light emitting elements LED. The second passivation layer PAS2 may prevent infiltration of impurities such as moisture or air from the outside to prevent damage to the plurality of light emitting elements LED.

The second planarization layer OC2 may be disposed on the second passivation layer PAS2 to cover the plurality of light emitting elements LED. The second planarization layer OC2 may planarize the top end of the light emitting element layer EML. For example, the second planarization layer OC2 may include an organic material to protect the light emitting element layer EML from foreign substances such as dust.

The wavelength conversion layer WLCL may include a first capping layer CAP1, a light blocking part BK, a plurality of touch electrodes SEN, a first wavelength conversion member WLC1, a second wavelength conversion member WLC2, and a light transmission member LTU, a second capping layer CAP2, and a third planarization layer OC3.

The first capping layer CAP1 may be disposed on the second planarization layer OC2. The first capping layer CAP1 may cover the bottom surfaces of the first and second wavelength conversion members WLC1 and WLC2, the light transmission member LTU, and the light blocking part BK. For example, the first capping layer CAP1 may seal the first and second wavelength conversion members WLC1 and WLC2 and the light transmission member LTU to prevent the first and second wavelength conversion members WLC1 and WLC2 and the light transmission member LTU from damage or contamination. For example, the first capping layer CAP1 may include an inorganic material.

The first wavelength conversion member WLC1 may be disposed in the first emission area EA1 on the first capping layer CAP1. The first wavelength conversion member WLC1 may be surrounded by the adjacent light blocking parts BK. The first wavelength conversion member WLC1 may include a first based resin BS1, a first scatterer SCT1, and a first wavelength shifter WLS1.

The first base resin BS1 may contain a material having a relatively high light transmittance. The first base resin BS1 may be formed of a transparent organic material.

The first scatterer SCT1 may have a refractive index different from that of the first base resin BS1 and form an optical interface with the first base resin BS1. For example, the first scatterer SCT1 may contain a light scattering material or light scattering particles that scatter at least a part of the transmitted light. The first scatterer SCT1 may scatter light in random directions regardless of the incidence direction of the incident light without any substantial change of the peak wavelength of the incident light.

The first wavelength shifter WLS1 may change or shift the peak wavelength of the incident light to a first peak wavelength. For example, the first wavelength shifter WLS1 may convert blue light provided from the display device 10 into red light having a single peak wavelength in the range of 610 nm to 650 nm and emit the red light.

The second wavelength conversion member WLC2 may be disposed in the second emission area EA2 on the first capping layer CAP1. The second wavelength conversion member WLC2 may be surrounded by the adjacent light blocking parts BK. The second wavelength conversion member WLC2 may include a second base resin BS2, a second scatterer SCT2, and a second wavelength shifter WLS2.

The second base resin BS2 may contain a material having a relatively high light transmittance. The second base resin BS2 may be formed of a transparent organic material.

The second scatterer SCT2 may have a refractive index different from that of the second base resin BS2 and form an optical interface with the second base resin BS2. For example, the second scatterer SCT2 may contain a light scattering material or light scattering particles scattering at least a part of the transmitted light. The second scatterer SCT2 may scatter the light in random directions regardless of the incidence direction of the incident light without any substantial change of the peak wavelength of the incident light.

The second wavelength shifter WLS2 may change or shift the peak wavelength of the incident light to a second peak wavelength different from the first peak wavelength of the first wavelength shifter WLS1. For example, the second wavelength shifter WLS2 may convert blue light provided from the display device 10 into green light having a single peak wavelength in the range of 510 nm to 550 nm and emit the green light.

The light transmission member LTU may be disposed in the third emission area EA3 on the first capping layer CAP1. The light transmission member LTU may be surrounded by the adjacent light blocking parts BK. The light transmission member LTU may allow the incident light to pass therethrough while maintaining the peak wavelength of the light. The light transmission member LTU may include a third base resin BS3 and a third scatterer SCT3.

The third base resin BS3 may contain a material having a relatively high light transmittance. The third base resin BS3 may be formed of a transparent organic material.

The third scatterer SCT3 may have a refractive index different from that of the third base resin BS3 and form an optical interface with the third base resin BS3. For example, the third scatterer SCT3 may contain a light scattering material or light scattering particles scattering at least a part of the transmitted light. The third scatterer SCT3 may scatter the light in random directions regardless of the incidence direction of the incident light without any substantial change of the peak wavelength of the incident light.

The light blocking part BK may be disposed in the light blocking area BA on the first capping layer CAP1. The light blocking part BK may cover the plurality of touch electrodes SEN. The light blocking part BK may overlap the second bank BNK2 in the thickness direction. The light blocking part BK may surround the first and second wavelength conversion members WLC1 and WLC2 and the light transmission member LTU in a plan view. The light blocking part BK may absorb visible light and transmit infrared and ultraviolet light. The light blocking part BK may be arranged in the form of a grid surrounding the first to third emission areas EA1, EA2, and EA3 in a plan view. The light blocking part BK may prevent light infiltration and color mixture between the first to third emission areas EA1, EA2, and EA3, which leads to the improvement of color reproducibility of the display device 10. Infrared or ultraviolet light passing through the light blocking part BK may be absorbed by the pixel defining layer DPL.

The plurality of touch electrodes SEN may be disposed on the first capping layer CAP1 and covered with the light blocking part BK. Accordingly, the plurality of touch electrodes SEN may be disposed in the wavelength conversion layer WLCL without requiring a separate touch sensor layer. The plurality of touch electrodes SEN may transmit light of a specific wavelength. The touch electrode SEN may be a transparent electrode including a transparent conductive material. When the camera captures an image of the spacer SPC using infrared or ultraviolet light, the spacer SPC may be distinguished from the first and second electrodes AE and CME, the touch electrode SEN, and the second bank BNK2.

The second capping layer CAP2 may be disposed on the first and second wavelength conversion members WLC1 and WLC2, the light transmission member LTU, and the light blocking part BK. The second capping layer CAP2 may seal the top surfaces of the first and second wavelength conversion members WLC1 and WLC2 and the light transmission member LTU to prevent the first and second wavelength conversion members WLC1 and WLC2 and the light transmission member LTU from damage or contamination. For example, the second capping layer CAP2 may include an inorganic material.

The third planarization layer OC3 may be disposed on the second capping layer CAP2 to flatten the top portion of the wavelength conversion layer WLCL. For example, the third planarization layer OC3 may include an organic material to protect the wavelength conversion layer WLCL from foreign substances such as dust.

Figure 20:
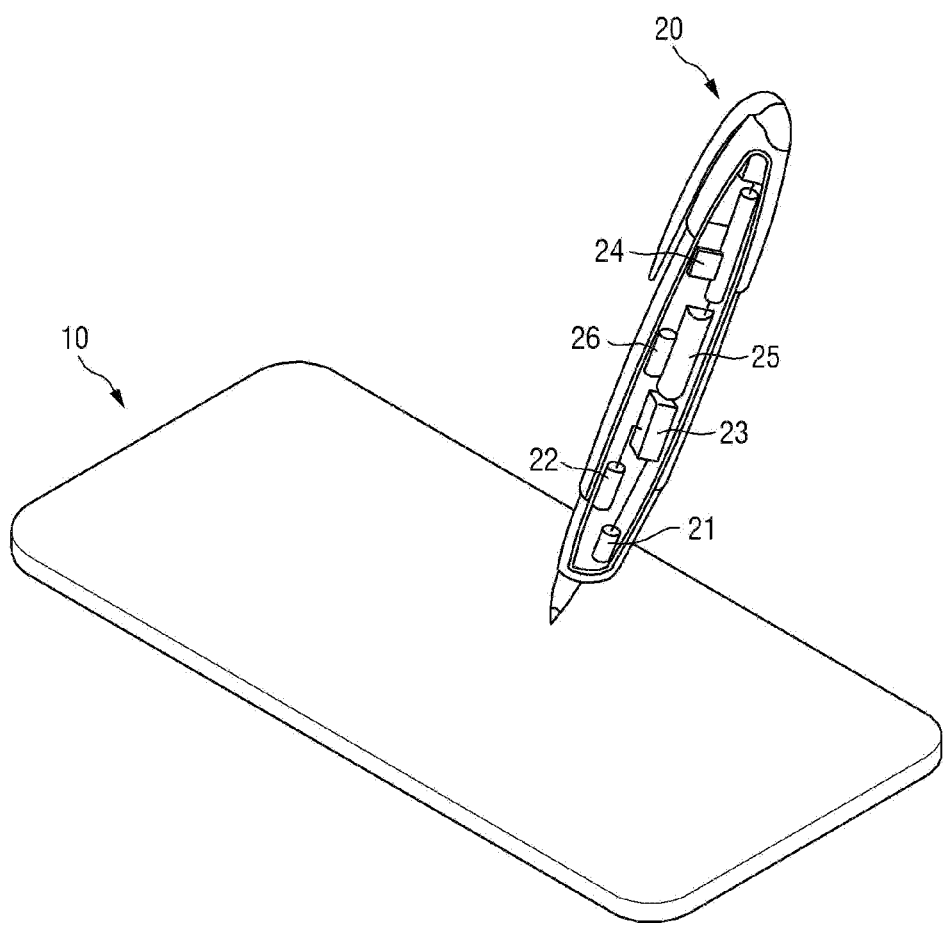
FIG. 20 is a perspective view illustrating a sensing system according to one embodiment.
Figure 21:
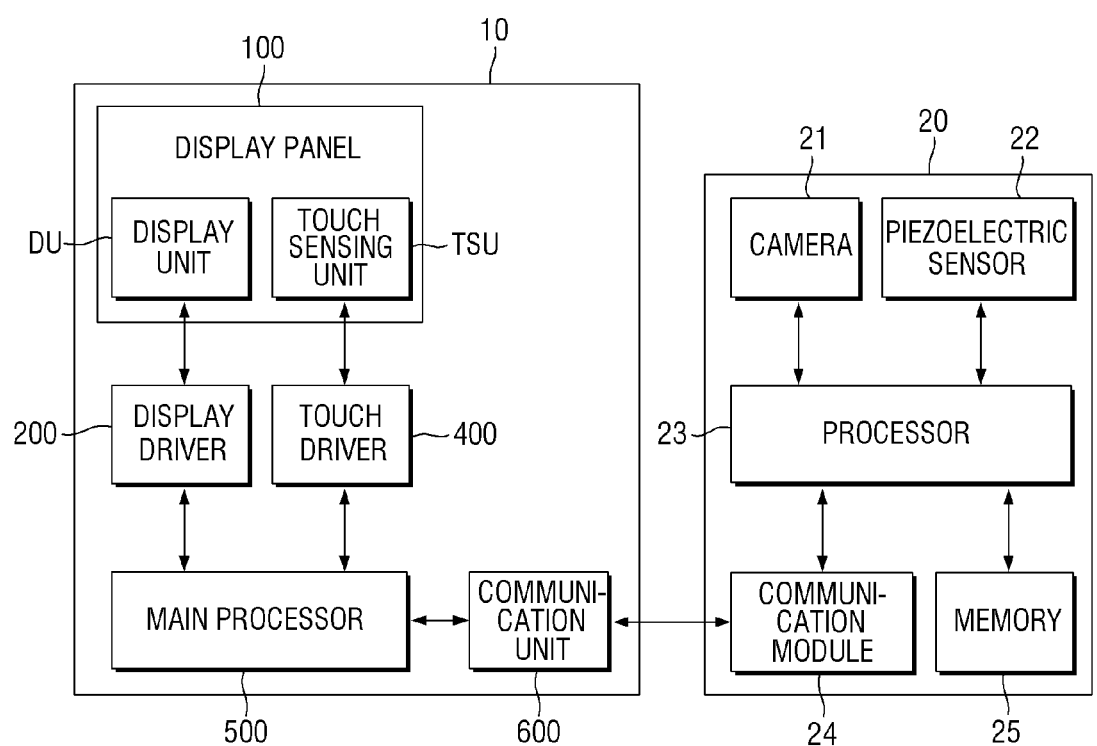
FIG. 21 is a block diagram illustrating a display device and an input device, in a sensing system according to one embodiment.

FIG. 20 is a perspective view illustrating a sensing system according to one embodiment. FIG. 21 is a block diagram illustrating a display device and an input device, in a sensing system according to one embodiment.

Referring to FIGS. 20 and 21, the sensing system may include a display device 10 and an input device 20.

The display device 10 may include the display panel 100, the display driver 200, the touch driver 400, a main processor 500, and a communication unit 600.

The display panel 100 may include the display unit DU and the touch sensing unit TSU. The display unit DU may include a plurality of pixels to display an image. The display unit DU may include the first substrate SUB1, the thin film transistor layer TFTL, and the light emitting element layer EML. The light emitting element layer EML may include the light emitting element LED, the pixel defining layer PDL, the spacer SPC, and the planarization layer OC.

The code pattern CP may be formed of the planar shape of the spacer SPC. A plurality of code patterns CP may be disposed over the entire display area DA, and each of the plurality of code patterns CP may have position information according to a specific criterion. The code pattern CP may be photographed by a camera 21 approaching the front of the display device 10, and may be identified through a captured picture or image. At least one code pattern CP or a combination of the code patterns CP may correspond to a preset data code value. For example, the code pattern CP disposed at a specific position may correspond to a data code designated at the corresponding position.

The touch sensing unit TSU may include the plurality of touch electrodes SEN to sense a user's touch in a capacitive manner.

The display driver 200 may output signals and voltages for driving the display unit DU. The display driver 200 may supply data voltages to data lines. The display driver 200 may supply a power voltage to the power line and may supply gate control signals to the gate driver.

The touch driver 400 may be connected to the touch sensing unit TSU. The touch driver 400 may supply a driving signal to a plurality of touch electrodes SEN of the touch sensing unit TSU and may sense an amount of change in capacitance between the plurality of touch electrodes SEN. The touch driver 400 may calculate whether a user's input is made and input coordinates based on an amount of change in capacitance between the plurality of touch electrodes SEN.

The main processor 500 may control all functions of the display device 10. For example, the main processor 500 may supply digital video data to the display driver 300 such that the display panel 100 displays an image. For example, the main processor 500 may receive touch data from the touch driver 400 to determine user's input coordinates, and then may generate digital video data according to the input coordinates, or execute an application indicated by an icon displayed on the user's input coordinates. As another example, the main processor 500 may receive coordinate data from the input device 20 to determine input coordinates of the input device 20, and then may generate digital video data according to the input coordinates or execute an application indicated by an icon displayed on the input coordinates of the input device 20.

The communication unit 600 may perform wired/wireless communication with an external device. For example, the communication unit 600 may transmit/receive a communication signal to/from a communication module 24 of the input device 20. The communication unit 600 may receive coordinate data composed of data codes from the input device 20, and may provide the coordinate data to the main processor 500.

The input device 20 may approach or be brought into contact with the display device 10 to perform an input to the display device 10. The input device 20 may include the camera 21, a piezoelectric sensor 22, a processor 23, the communication module 24, a memory 25, and a battery 26. For example, the input device 20 may be an input pen that generates coordinate data using an optical method. The input pen may be a smart pen, an electromagnetic pen, or an active pen, but is not limited thereto.

The camera 21 may be disposed at one end of the input device 20. The camera 21 may photograph the code pattern CP determined by the planar shape of the pixel defining layer PDL. Along the movement of the input device 20, the camera 21 may continuously photograph the code pattern CP of the corresponding position. The camera 21 may provide the captured image to the processor 23.

The piezoelectric sensor 22 may sense a pressure applied by the input device 20 to the display device 10. The piezoelectric sensor 22 may provide pressure information of the input device 20 to the processor 23.

The processor 23 may receive an image of the code pattern CP from the camera 21. The processor 23 may convert the code pattern CP into a corresponding data code, and may generate coordinate data by combining the data codes. The processor 23 may transmit the generated coordinate data to the display device 10 through the communication module 24.

The processor 23 may receive the image of the code pattern CP and convert at least one code pattern CP or a combination of the code patterns CP into a data code corresponding one-to-one, thereby rapidly generating the coordinate data without complex calculation and correction. Accordingly, the sensing system may perform a corresponding function based on accurate input coordinates, reduce cost and power consumption, and simplify a driving process. In addition, the sensing system may include the plurality of code patterns CP determined by the planar shape of the spacer SPC, so that it may not be limited in size and may be applied to all electronic devices having a touch function.

The communication module 24 may perform wired/wireless communication with an external device. For example, the communication module 24 may transmit/receive a communication signal to/from the communication unit 600 of the display device 10. The communication module 24 may receive coordinate data composed of data codes from the processor 23, and may provide the coordinate data to the communication unit 600.

The memory 25 may store data necessary for driving the input device 20. Since the input device 20 may convert at least one code pattern CP or a combination of the code patterns CP into a data code corresponding one-to-one and may directly provide coordinate data to the display device 10, it may include the memory 25 having a relatively small capacity.

What is claimed is:

1. A display device comprising:
a first substrate;
a thin film transistor layer disposed on the first substrate and including a plurality of thin film transistors;
a pixel defining layer disposed on the thin film transistor layer and defining a plurality of emission areas;
a pixel electrode disposed in each of the emission areas on the thin film transistor layer;

a plurality of spacers disposed on the pixel defining layer and distinguished from the pixel defining layer and the pixel electrode with respect to light of a specific wavelength;
a touch electrode disposed on the plurality of spacers and configured to receive an input from an outside; and
a code pattern having position information determined by a planar shape of each of the plurality of spacers.

2. The display device of claim 1, wherein the plurality of spacers absorb light of the specific wavelength, and the pixel defining layer and the pixel electrode transmit or reflect light of the specific wavelength.

3. The display device of claim 1, wherein the plurality of spacers are irregularly arranged in plan view to form the code pattern.

4. The display device of claim 1, wherein a transmittance of the plurality of spacers with respect to a wavelength of 800 nm to 900 nm is 15% or less.

5. The display device of claim 1, further comprising a second substrate disposed on the plurality of spacers and supported by the plurality of spacers,
wherein the touch electrode is disposed on the second substrate.

6. The display device of claim 5, further comprising:
a plurality of color filters disposed in the plurality of emission areas on the second substrate; and
a plurality of light blocking parts surrounding each of the plurality of color filters on the second substrate,
wherein the touch electrode is covered by the light blocking part.

7. The display device of claim 5, further comprising:
an insulating layer disposed on the second substrate;
a plurality of color filters disposed in the plurality of emission areas on the insulating layer; and
a plurality of light blocking parts surrounding each of the plurality of color filters on the insulating layer,
wherein the touch electrode is covered by the insulating layer.

8. The display device of claim 1, further comprising an encapsulation layer disposed on the pixel defining layer, the pixel electrode, and the spacers,
wherein the touch electrode is disposed on the encapsulation layer.

9. The display device of claim 1, wherein the code pattern located at a specific position corresponds to a data code designated at a corresponding position.

10. A display device comprising:
a first substrate;
a thin film transistor layer disposed on the first substrate and including a plurality of thin film transistors;
a pixel defining layer disposed on the thin film transistor layer and defining a plurality of emission areas;
a pixel electrode disposed in the emission area on the thin film transistor layer;
a plurality of spacers disposed on the pixel defining layer;
a touch electrode disposed on the plurality of spacers and configured to receive an input from an outside; and
a code pattern having position information determined by a planar shape of each of the plurality of spacers,
wherein the plurality of spacers include a first spacer distinguished from the pixel defining layer and the pixel electrode with respect to light of a specific wavelength, and a second spacer formed of the same material as the pixel defining layer.

11. The display device of claim 10, further comprising a code pattern having position information determined by a planar shape of the first spacer.

12. The display device of claim 11, wherein the plurality of spacers are regularly arranged in plan view, and first spacers among the plurality of spacers are irregularly arranged in plan view to form the code pattern.

13. The display device of claim 10, wherein the first spacer absorbs light of the specific wavelength, and the second spacer, the pixel defining layer, and the pixel electrode transmit or reflect light of the specific wavelength.

14. The display device of claim 10, further comprising a second substrate disposed on the plurality of spacers and supported by the plurality of spacers,
wherein the touch electrode is disposed on the second substrate.

15. The display device of claim 10, further comprising an encapsulation layer disposed on the pixel defining layer, the pixel electrode, and the spacer,
wherein the touch electrode is disposed on the encapsulation layer.

16. The display device of claim 10, wherein the code pattern located at a specific position corresponds to a data code designated at a corresponding position.

17. A display device comprising:
a first substrate;
a thin film transistor layer disposed on the first substrate and including a plurality of thin film transistors;
a pixel defining layer disposed on the thin film transistor layer and defining a plurality of emission areas;
a pixel electrode disposed in each of the emission areas on the thin film transistor layer;
a plurality of spacers disposed on the pixel defining layer; and
a coating pattern disposed on at least some of the plurality of spacers; and
a touch electrode disposed on the plurality of spacers and the coating pattern and configured to receive an input from an outside.

18. The display device of claim 17, further comprising a code pattern having position information determined by a planar shape of the coating pattern.

19. The display device of claim 18, wherein the plurality of spacers are regularly arranged in plan view, and the coating pattern is irregularly arranged in a plan view to form the code pattern.

20. The display device of claim 17, wherein the coating pattern absorbs light of a specific wavelength, and the spacer, the pixel defining layer, and the pixel electrode transmit or reflect light of the specific wavelength.

21. A sensing system comprising:
a display device configured to display an image; and
an input device configured to approach or be brought into contact with the display device to perform an input to the display device,
wherein the display device comprises:
a first substrate;
a thin film transistor layer disposed on the first substrate and including a plurality of thin film transistors;
a pixel defining layer disposed on the thin film transistor layer and defining a plurality of emission areas;
a pixel electrode disposed in each of the emission a reason the thin film transistor layer;
a plurality of spacers disposed on the pixel defining layer and distinguished from the pixel defining layer and the pixel electrode with respect to light of a specific wavelength;
a touch electrode disposed on the plurality of spacers and configured to receive an input from an outside; and a code pattern having position information determined by a planar shape of each of the plurality of spacers, wherein the input device captures an image of the code pattern, converts the code pattern into a preset data code, and transmits coordinate data composed of the data codes to the display device.

22. The sensing system of claim 21, wherein the input device comprises:

a camera configured to capture an image of the code pattern;

a processor configured to analyze the image of the code pattern, convert the code pattern into a preset data code, and generate coordinate data composed of the data codes; and a communication module configured to transmit the coordinate data to the display device.

\* \* \* \* \*